US012651638B2

(12) United States Patent
Casarsa

(10) Patent No.: US 12,651,638 B2
(45) Date of Patent: *Jun. 9, 2026

(54) RANDOM ACCESS MEMORY AND CORRESPONDING METHOD FOR MANAGING A RANDOM ACCESS MEMORY

(71) Applicant: STMICROELECTRONICS S.r.l., Agrate Brianza (IT)

(72) Inventor: Marco Casarsa, Vaprio d'Adda (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/773,006

(22) Filed: Jul. 15, 2024

(65) Prior Publication Data

US 2024/0404613 A1 Dec. 5, 2024

Related U.S. Application Data

(63) Continuation of application No. 18/300,091, filed on Apr. 13, 2023, now Pat. No. 12,073,897.

(30) Foreign Application Priority Data

Apr. 22, 2022 (IT) ........................ 102022000007967

(51) Int. Cl.
*G11C 29/02* (2006.01)
*G06F 12/02* (2006.01)

(52) U.S. Cl.
CPC .......... *G11C 29/023* (2013.01); *G06F 12/023* (2013.01); *G06F 2212/202* (2013.01)

(58) Field of Classification Search
CPC ... G11C 29/023; G11C 11/417; G11C 11/419; G11C 19/287; G11C 29/46; G11C 29/12015; G11C 2029/3202; G11C 29/20; G11C 29/32; G06F 12/023; G06F 2212/202
See application file for complete search history.

(56) References Cited

U.S. PATENT DOCUMENTS 12,073,897 B2 * 8/2024 Casarsa ................. G11C 11/419
2015/0206559 A1 7/2015 Priel et al.
(Continued)

OTHER PUBLICATIONS

Teman et al., "Controlled Placement of Standard Cell Memory Arrays for High Density and Low Power in 28nm FD-SOI," the 20th Asia and South Pacific Design Automation Conference, IEEE, 2015, pp. 81-86.

*Primary Examiner* — Thien Nguyen
(74) *Attorney, Agent, or Firm* — Seed IP Law Group LLP

(57) ABSTRACT

A random access memory (RAM) includes an array of arranged in rows and columns. The rows of the storage elements correspond to respective memory locations of the RAM. The storage elements of a row have a common gated-clock input and respective data inputs, and each row of the array of storage elements includes a plurality of D type latches. In operation, an address input of the RAM receives a memory address identifying a memory location in the RAM. Clock gating circuitry of the RAM, generates respective gated-clock signals for the rows of the array of storage elements based on the memory address received at the address input. Memory operation are performed using storage elements of the array based on the gated-clock signals.

20 Claims, 17 Drawing Sheets

(56)  References Cited

U.S. PATENT DOCUMENTS

| | | |
|---|---|---|
| 2020/0059223 A1 | 2/2020 | Samra et al. |
| 2022/0139478 A1 | 5/2022 | Ziaja et al. |
| 2023/0005560 A1 | 1/2023 | Ziaja et al. |
| 2023/0343405 A1 | 10/2023 | Casarsa |

* cited by examiner

RANDOM ACCESS MEMORY AND CORRESPONDING METHOD FOR MANAGING A RANDOM ACCESS MEMORY

BACKGROUND

Technical Field

Embodiments of the present disclosure relate to a Random Access Memory.

Embodiments of the present disclosure relate in particular to Random Access Memory designed for testability, in particular to Single Port Random Access Memory and Dual Port Random Access Memory.

Description of the Related Art

A RAM (Random Access Memory) memory comprises an analog portion, in particular represented by a memory array, and includes also boundary logic that is digital, that is usually specifically designed in order to optimize the device area impact. This circuit, differently from the digital logic of the device, tested with SCAN Architecture, requires a specific Built-In Self-Test (BIST) hardware controller to ensure quality. However, when RAM memories are small there is always a debate to minimize the area since a Built-In Self Test hardware controller together with the embedded RAM control logic might have a not negligible area overhead with respect to the RAM matrix (e.g., in some cases the BIST might have area size similar to the RAM size).

A known solution relies on replacing the RAM memory matrix with standard flip-flops and adding digital control logic to obtain a same timing waveform as specified in the RAM datasheet.

Despite this solution ensure a good test coverage since flip-flops are integrated in the device scan chain architecture, the area penalty is so severe that it is almost always not convenient to replace RAMs with such architecture.

BRIEF SUMMARY

In an embodiment, a random access memory (RAM) comprises an array of storage elements arranged in rows and columns. The rows of the storage elements correspond to respective memory locations of the RAM. The storage elements of a row have a common gated-clock input and respective data inputs, and each row of the array of storage elements comprises a plurality of D type latches. The memory includes an address input, which, in operation, receives a memory address identifying a memory location in the RAM. Clock gating circuitry has an input coupled to the address input, and includes test mode control logic, which, in operation, generates a test mode enable signal based on a test mode signal and a scan enable signal, and a plurality of clock gating cells, which, in operation, generate respective gated-clock signals for the rows of the array of storage elements based on the memory address received at the address input and the test mode enable signal.

In an embodiment, a system comprises processing circuitry and a random access memory (RAM) coupled to the processing circuitry. The RAM includes an array of storage elements arranged in rows and columns. The rows of the storage elements correspond to respective memory locations of the RAM. The storage elements of a row have a common gated-clock input and respective data inputs, and each row of the array of storage elements comprises a plurality of D type latches. The memory includes an address input, which, in operation, receives a memory address identifying a memory location in the RAM. Clock gating circuitry has an input coupled to the address input, and includes test mode control logic, which, in operation, generates a test mode enable signal based on a test mode signal and a scan enable signal, and a plurality of clock gating cells, which, in operation, generate respective gated-clock signals for the rows of the array of storage elements based on the memory address received at the address input and the test mode enable signal.

In an embodiment, a method includes receiving, on an address input of a random access memory (RAM), a memory address identifying a memory location in the RAM. The RAM includes an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches. Respective gated-clock signals for the rows of the array of storage elements are generated based on the memory address received at the address input, a test mode signal and a scan enable signal. Memory operations are performed using storage elements of the array based on the gated-clock signals.

In an embodiment, a random access memory (RAM), comprises an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches. An address input of the RAM, in operation, receives a memory address identifying a memory location in the RAM. Clock gating circuitry having an input coupled to the address input, in operation, generates respective gated-clock signals for the rows of the array of storage elements based on the memory address received at the address input. The array of storage elements comprises a column of D type flip flops.

In an embodiment, a system comprises processing circuit, and a random access memory (RAM) coupled to the processing circuitry. The RAM includes an array of storage elements arranged in a plurality of rows and a plurality of columns. The rows of the storage elements correspond to respective memory locations of the RAM. The storage elements of a row have a common gated-clock input and respective data inputs, and rows of the array of storage elements comprise a plurality of D type latches. An address input, in operation, receives a memory address identifying a memory location in the RAM. Clock gating circuitry having an input coupled to the address input, in operation, generates respective gated-clock signals for the rows of the array of storage elements based on the memory address received at the address input. The array of storage elements comprises a column of D type flip flops.

In an embodiment, a method includes receiving, on an address input of a random access memory (RAM), a memory address identifying a memory location in the RAM. The RAM includes an array of storage elements arranged in rows and columns, wherein the rows of the storage elements correspond to respective memory locations of the RAM, the storage elements of a row have a common gated-clock input and respective data inputs, each row of the array of storage elements comprises a plurality of D type latches, and the array of storage elements comprises a column of D type flip flops. Respective gated-clock signals for the rows of the array of storage elements are generated, using clock gating circuitry of the RAM having an input coupled to the address input, based on the memory address received at the address input. A memory operation is performed using storage elements of the array based on the gated-clock signals.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
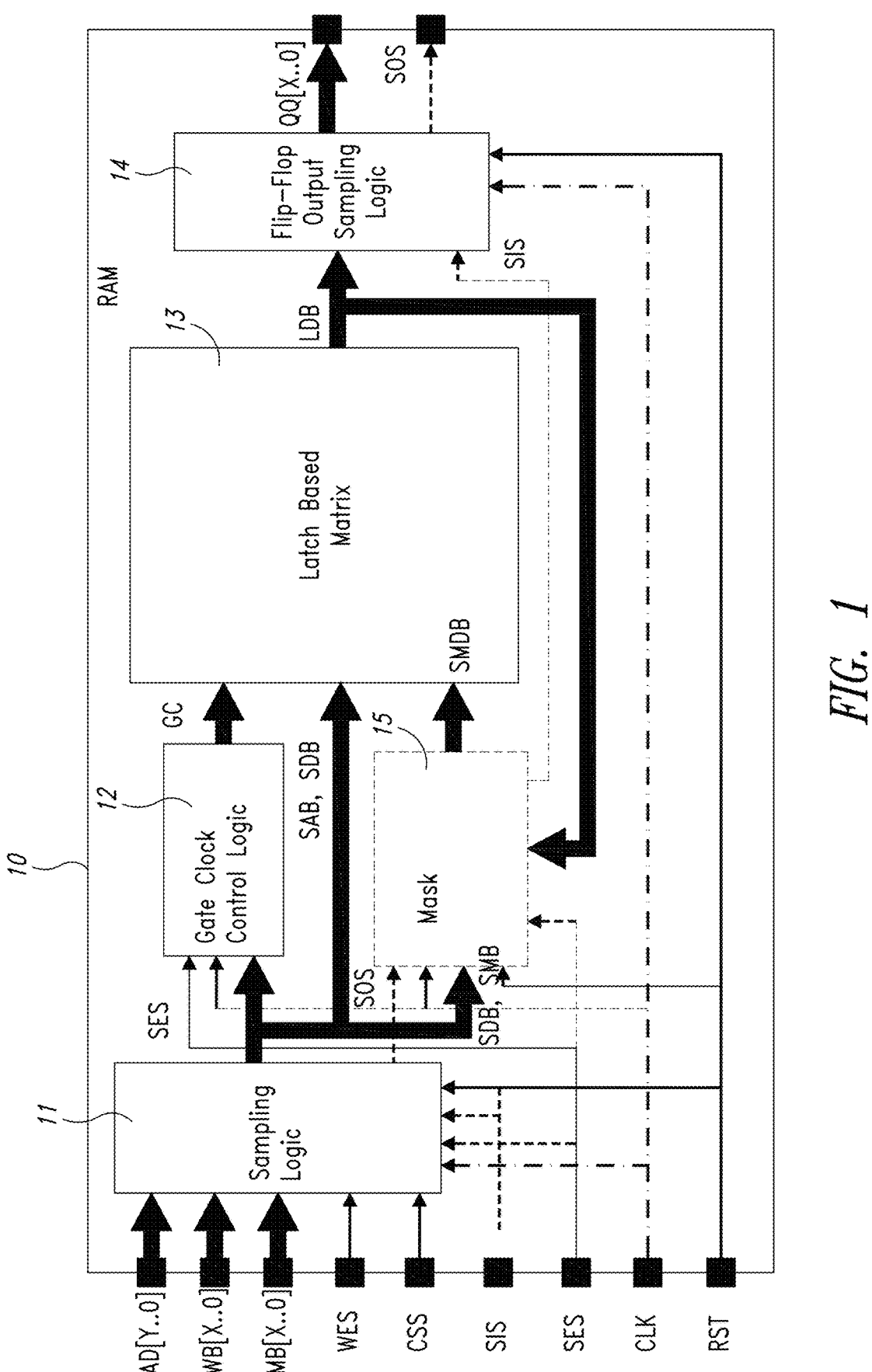
FIG. 1 shows schematically a single port memory according to embodiments.

In FIG. 1 it is shown an architecture, indicated by the numerical reference 10, of a single port RAM memory according to an embodiment of the solution here described. The block indicated with 10 defines the boundary of the single port RAM which includes a flip-flop input sampling logic 11, to sample the input boundary signals with a clock signal CLK, a clock gate control logic 12, to provide a latch based matrix 13 with respective gated clock signals GC for each address associated to a location in said latch matrix 13, which is the block where the data are stored, then a flip-flop output sampling logic 14, to sample the output boundary signals, and optional mask data management module 15, when the RAM 10 has masking capability, e.g., the capability of masking the writing of some data bits so that they can maintain the status they already have. The matrix 13 comprises as memory storage elements latches, for example D latches. This as opposed to a matrix having as storage elements flip-flops which are in general combinations of latches, in particular a combination of two cascaded latches with clock inverted to have master-slave behavior.

The single port RAM 10 receives as input boundary signals interface signals that are usually available for RAM memory, namely:

an address bus signal AD, or AD[Y . . . 0], a bus carrying the addresses with bits from bit Y to bit 0, which is supplied as input of the flip-flop input sampling logic 11 for sampling with the clock signal CLK, the clock of the RAM memory clock domain, and it is the address on the bus that defines the memory location to be read/written;

a data bus WB [X . . . 0], a bus signal, with bits from bit X to bit 0, carrying the data to be written, or stored, in the latch memory 13 in the selected memory location, which is supplied as input of the flip-flop input sampling logic 11 for sampling with the clock signal CLK;

a mask bus MB [X . . . 0], a bus signal, with bits from bit X to bit 0, carrying mask values, that allow to mask some bits when data is written (to allow bit/byte write manipulation), which also is supplied as input of the flip-flop input sampling logic 11 for sampling with the clock signal CLK;

a write enable signal WES, to enable writing in the single port RAM 10, which is supplied as input of the flip-flops input sampling logic 11 for sampling with the clock signal CLK; signal WES is the signal that defines the working mode of the memory. Depending on the logical value of the signal WES two possible alternatives are: write or read a memory location in the latch memory 13.

a chip selection signal CSS, which is supplied as input of the flip-flop input sampling logic 11 for sampling with the clock signal CLK; the chip selection signal CSS is the signal that defines whether the memory 13 is selected. When the value is off, the memory 13 is not read or written, independently from the status of the signals WES, AD, WB, or MB.

then the input boundary signals include, as mentioned, a clock signal CLK, which clocks the operation of the memory 10 and is sent to the flip-flop input sampling logic 11 for sampling the signals with the clock CLK and to the other block 12, 14, 15 which operate clocked by such signal CLK. The clock CLK is represented by a dot dashed line in the figures;

a reset signal RST, sent to blocks 11, 14 and 15, to reset
their state, more in particular to reset the status of the
FFs respectively included.

The single port memory 10 then receives as input bound-
ary signals, test signals, specifically Scan In signal SIS and
Scan Out SOS, which are test signals to integrate a scan
chain structure in the device. As indicated, with Scan In
signal SIS is indicated the signal of the scan path inputting
a block, while with Scan Out signal SOS is indicated the
signal of the Scan path outputting a block. These signals are
not mandatory since scan insertion can be done also a device
level—while here is supposed at RAM level- and in such a
case these signals may be created automatically during this
step. A scan enable signal SES is also received at input of
RAM 10 which is a test signal to define the shift versus
capture operation of the scan chain structure, while the reset
signal RST, as better illustrated in the following, is used to
initialize the status of the internal flip-flops (FF) in input
sampling logic block 11, as well as in output sampling block
14 and mask 15. All the flip flops of the RAM 10 may be
SCAN ready and may be inserted in the scan chain structure
allowing to reach the ATPG (Automatic Test Pattern Gen-
eration) coverage target. A scan ready flip-flop in general
may be a D flip-flop with a 2×1 multiplexer added at its input
D, as better seen in FIG. 2, for instance in flip flop FFA$_0$.
Besides the data D input, clock input CK, a test enable TE
input is provided (which is coupled to the scan enable
signals, SES) and Test In TI (which is coupled to the scan in
signal SIS). One input of the multiplexer acts as the func-
tional input D when TE=0, e.g., the memory 10 is used in
functional, normal, mode, thus providing the normal output
Q, and the other input serving as the Scan-In (SI) input when
TE=1, e.g., the memory 10 is in test mode, thus providing
the output on the Scan Out SO pin, although it may have a
different timing (normally more relaxed to prevent HOLD
timing issues during the shift). In general, when test enable
TE is equal to logic one, the shift operation occurs—not
simply Test mode- (TI sampled) in the scan chains (to
serially load/unload), while when test enable TE is equal to
logic zero, the functional mode is enabled (input D
sampled). Thus, the TE pin is used to control the multiplexer
of the scan ready flip flop, e.g., used as selection bit. As
mentioned, all the scan ready flip flops of input sampling
logic block 11 have also a reset pin coupled to the reset
signal RST.

Figure 2:
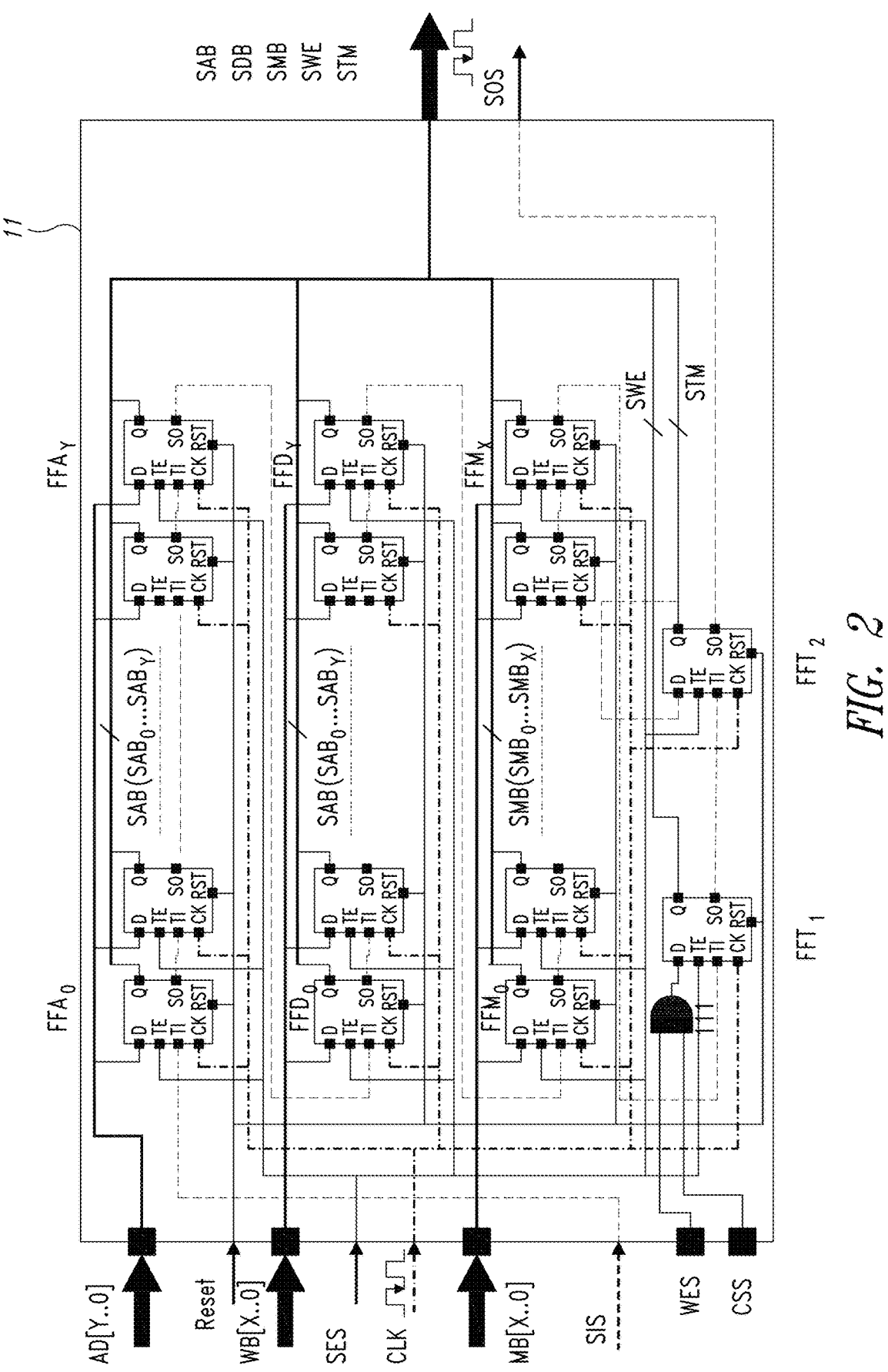
FIG. 2 shows schematically an input sampling of logic of said single port memory according to embodiments.

In FIG. 2 it is shown in detail the input sampling block 11,
which receives the input signals indicated above, and com-
prises a first row of address resampling scan ready delay flip
flops FFA, from FFA$_0$ to FFA$_Y$ for each of the Y+1 bits on
the AD bus in order which is brought to the data input D of
the respective flip flop FFA$_j$, j index from 0 to Y. The Scan
in signal SIS is brought to the TI input of the first flip FFA$_0$,
while output SO is coupled to the TI input of the following
flip flop, and so on, this being exemplary of a possible way
according to which the flip flops are cascaded with respect
to the scan in signal SIS, e.g., a possible implementation of
a scan daisy chain, although other implementations are
possible. The Scan Enable signal SES is brought in parallel
to all the flip flops FFA, to the TE input. The clock signal
CLK is brought to their clock input CK. On the output Q of
each address resampling flip flop FFA$_j$ is a sampled address
bit SAB$_j$, which is collected by a bus of sampled address bits
SAB, carrying the Y+1 bits SAB$_0$ . . . SAB$_Y$ which are used
to obtain the memory locations ML0 . . . MLW in the latched
memory 13. The memory locations ML0 . . . MLW are in a number which is a power of two with respect to the
corresponding Y+1 bits SAB$_0$ . . . SAB$_Y$, e.g., 4 SAB bits
means 16.

Then, input sampling logic block 11 includes a second
row of data resampling scan ready flip flops FFD, from
FFD$_0$ to FFD$_X$, for each of the X+1 bits on the data bus WB
in order, which are brought to the data input D of the
respective flip flop FFD$_i$, I index from 0 to X. On the output
Q of each data resampling flip flop FFD$_i$ is a sampled data
bit SDB$_i$, which is collected by a bus of sampled data bits
SDB, carrying the X+1 data bits SDB$_0$ . . . SDB$_X$. The TI
input of the first flip FFD0 is coupled to the output SO of the
last address resampling flip flop FFA$_Y$, then the other flip
flops are cascaded in the same way of the address flip flops
for the scan daisy chain, the Scan Enable signal SES being
also brought in parallel to all the flip flops FFD, to the TE
input and the clock signal CLK being brought to their clock
input CK.

Then, input sampling logic block 11 includes optionally a
third row of mask resampling scan ready flip flops FFM,
from FFM$_0$ to FFM$_X$, for each of the X+1 bits on the mask
bus MB in order, which are brought to the data input D of
the respective flip flop FFM$_i$. On the output Q of each data
resampling flip flop FFM$_i$ is a sampled mask bit SMB$_i$,
which is collected by a bus of sampled mask bits SMB,
carrying the X+1 mask bits SMB$_0$ . . . SMB$_X$. Again, the TI
input of the first flip FFM0, is coupled to the output SO of
the last data resampling flip flop FFD$_X$, then the other flip
flops are cascaded with respect to the scan in signal SIS in
the same way of the address flip flops for the scan daisy
chain, the Scan Enable signal SES being also brought in
parallel to all the flip flops FFD, to the TE input and the
clock signal CLK being brought to their clock input CK. The
scan path associated to the Scan In signal SIS is shown by
a dashed line in the figures, the Scan Enable signal SES in
solid line. The clock CLK is represented by a point dash line.

Input sampling logic block 11 comprises a sampled write
enable signal SWE, as output, which is the sampled AND,
in a AND port 111, between the write enable signal WES and
the chip select signal CSS and is used to validate the Write
Enable operation when Chip Select is active. The sampling
of the output of the AND gate 111 is performed by a first test
flip flop FFT1, also a scan ready flip flop, which receives the
output of such AND 111 in the data D input and outputs on
the Q pin the sampled write enable signal SWE.

Moreover, a FF Sampled Test Mode signal STM is
provided as the output of input sampling block 11, outputted
by a second test flip-flop FFT2, also a scan ready flip flop
like the others, with the output Q coupled to the data input
D, which is not used however in functional mode, e.g., for
normal operation of the RAM, but is used in ATPG Scan
mode to give more flexibility to ATPG engine in managing
the Enable of the Clock Gating GC included in the Clock
Gate Control Block 12.

The scan path, e.g., the scan in signal SIS, in the example
shown is propagated in the cascade of the first row, second
row, third row of flip flops, then in FFT1 and FFT2, where,
from the output SO, is brought at the output of block 11 as
scan out signal SOS. As mentioned, other implementations
of the scan chain are possible.

All these signals are sampled in the exemplary embodi-
ment on the falling edge of clock CLK. This is highlighted
in FIG. 2, showing the arrow in the clock CLK waveform
from high to low (so falling edge). Operation is possible also
with reverted edges, e.g., on the rising edge.

Figure 3:
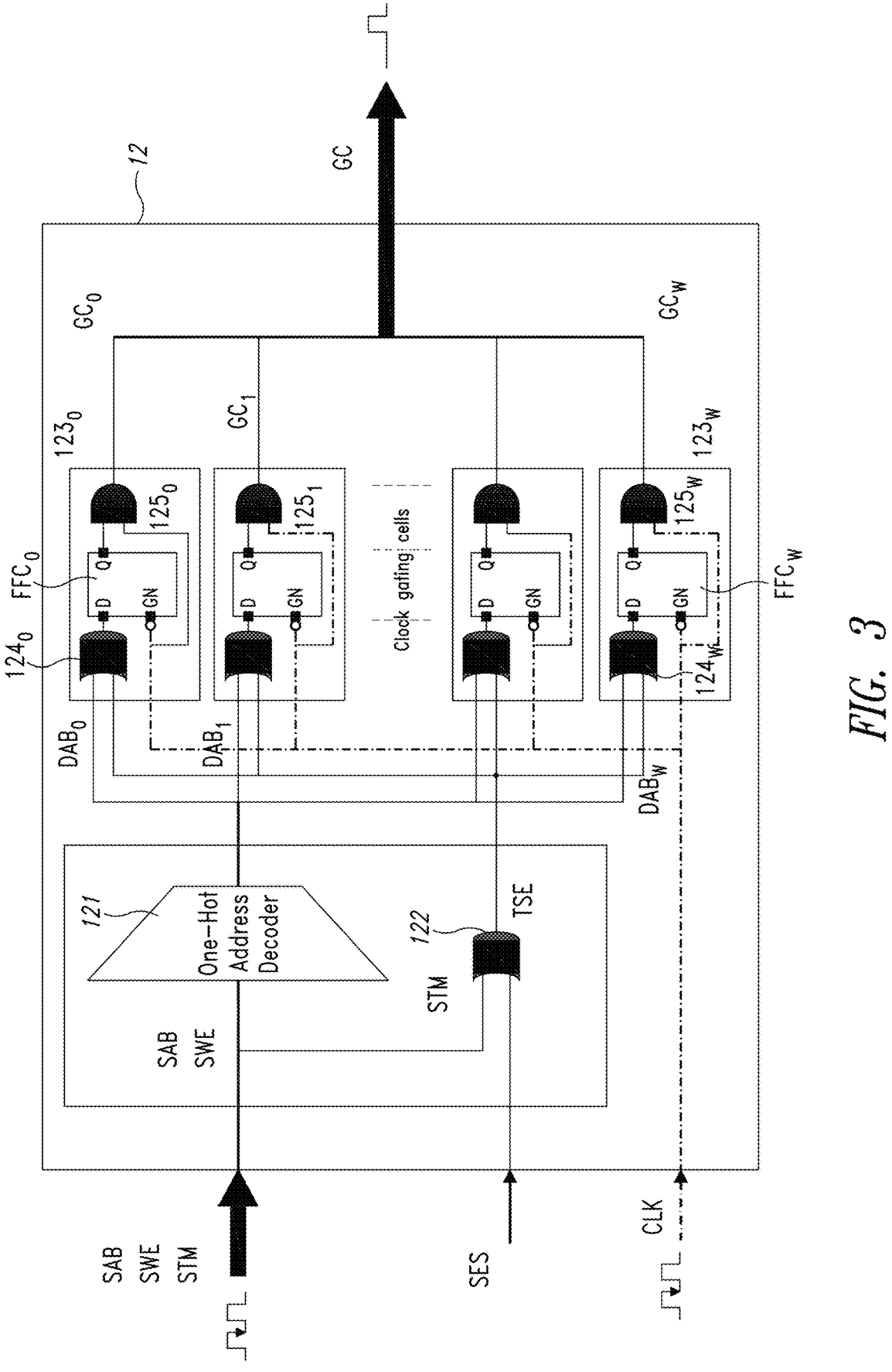
FIG. 3 shows schematically a clock gate control logic of said single port memory according to embodiments.

In FIG. 3 it is shown the clock gate control logic 12, which is the block that generates gated clock signals GC, $W=2^{Y+1}-1$ signals, to the RAM latched matrix 13 on selected address RAM location ML0 . . . ML$_W$, which thus in functional mode, is activated one-hot, and when write operation is valid, as indicated by the Sampled Write Enable SWE which is generated by the write enable WS conditioned with chip selection CS in the FF sampling input block 11, as described previously. As mentioned, RAM locations ML$_0$ . . . ML$_W$ are values which are in a total number of $2^{Y+1}$.

With 121 is indicated thus a one hot address decoder, e.g., which outputs decoded signals in the form of sequence of bits with only one logic one, receiving the address signal SAB and sampled write enable SWE and outputting one hot decoded address signals DAB$_0$ . . . DAB$_W$ to respective integrated clock gating cells 123$_0$ . . . 123$_W$, which output a respective gated clock signals GC$_0$ . . . GC$_W$. Such sequences of bits with only one logic one, as mentioned, are a power of two with exponent the corresponding address signal SAB, e.g., with 4 bit of address signal SAB, 16 gated clock signals GC$_0$ . . . GC$_W$ are generated. It may be possible that not all the memory bits are used (e.g., a memory with 13 rows has 4 SAB bits but only 13 gated clock signals GC).

A test logic 122, in particular embodied here by an OR gate, receives at its input the test mode signal STM and the scan enable SES, outputting a test mode enable signal TSE. Each clock gating cell 123$_j$ in the example shown comprises an OR input gate 124$_j$ receiving the decoded address DAB$_j$ and the test mode enable signal TSE and supplying its output to the data input D of a cell latch FFC$_j$, which receives at its clock input GN the negated of the clock CLK. When clock input GN is low the latch is transparent. The clock CLK is brought to an input of an AND gate 125$j$, which gates such clock CLK with the output of the cell latch FFC$_j$ received at its other input, thus outputting a gated address GC$_j$, the pulse of clock CLK corresponding to the one in the corresponding one hot decoded address signals DAB$_j$, which is thus a pulse on positive clock CLK as consequence of the FF input sampling 11 happening on the falling edge of clock CLK so that there is no timing trouble (clocks are the most often signals to introduce timing issues, and so are typically managed in the cleanest way). As above, the implementation of the clock gate control logic 12 shown in FIG. 3 may operate on clock falling edges, although in variant embodiments the clock gate control logic 12 may be rearranged to operate with all the clock edges inverted. The integrated clock gating cells 123 logic arrangement, of which in the FIG. 3 is given an example suitable for the falling edge, may be adapted accordingly to perform the integrated clock gating function.

To ensure the coverage, according to a relevant aspect of the solution here described, the OR 122 between Sampled Test Mode STM and Scan Enable signal SES is introduced, a logic gate which operates in combination with the one hot address decoder.

Thus, for what regards the OR 122 between Scan Enable signal SES and Sampled Test Mode STM, these two signals are enabled in the following conditions:

Scan enable SES: when scan chains are shifted in/out (so when the scan chains are used in ATPG shift mode); and Sampled Test Mode STM: when the relative Flip-Flop FFT2 included in the Flip-Flop Input sampling logic 11 is loaded to logic one.

Scan chain operation in ATPG involves three stages: Scan-in, Scan-capture and Scan-out. Scan-in involves shifting in and loading all the flip-flops with an input vector.

During scan-in, the data flows from the output of one flip flop to the scan-input of the next flip flop (as depicted in FIG. 2 for block 11) not unlike a shift register. Once the sequence is loaded, one clock pulse (also called the capture pulse) is allowed to excite the combinatorial logic block and the output is captured. In the scan-capture phase each flip-flop samples the data as in functional mode through the combo logic connected in between the output Q of the scan FF and their input D. This is because Scan-Enable SES is off. The data is then shifted out and the signature is compared with the expected signature.

Now, the behavior of the OR 122 in ATPG shift mode is analyzed.

In this condition the signal Scan enable SES is active, e.g., logic one, and so, even if the content of the Sampled Test Mode STM might toggle (it is itself part of the scan chain or chains), the output of the OR 122 is always active, e.g., logic one. This condition forces all the clock gate cells 123 active (because OR gate 124 output is always active) and so to clock all the latches of the RAM Latch matrix 13 (differently from the user or functional, or normal, mode where only one latch might be clocked).

As consequence, as depicted in following dealing with the Scan Chain structure, all the RAM latches become slave of the flip flops which drive the input D of the latches of matrix 13, which are either located in block 15 when the mask capability is included, or in block 11 (data bits WB). As better explained in the following, when the mask bit capability is available, then the mask block 15 is the driver and so the data are coming from flip-flops 152 (152$_0$ . . . 152$_X$) which supply data mask bits MDB bus, while when there is no mask capability are driven by flip-flops FFD (FFD$_0$ to FFD$_X$), which supply sampling data bits SDB$_0$ . . . SDB$_X$. This prevents having an unknown status "X" at the end of the shift phase on all the RAM latch 13 component which instead will have a deterministic value. This helps ATPG detecting faults and prevents unknown status "X" propagation which is very detrimental for the operation of a Logic BIST.

At the end of the shift mode, the ATPG applies the capture mode. This is the mode in which clock is pulsed and next state is loaded from the previous pre-loaded one through scan shift architecture. In this mode Scan enable is quite always NOT active and, in this condition, Sampled Test mode STM play a role. When not active, only one clock gating cell 123 might be active while when active all the clock gating cells 123 are active. This will allow the ATPG engine to have more freedom in detecting faults.

The latch-based matrix 13 may be implemented in various ways, for example, three different embodiments, each having a respective difference, are described herein.

Figure 4:
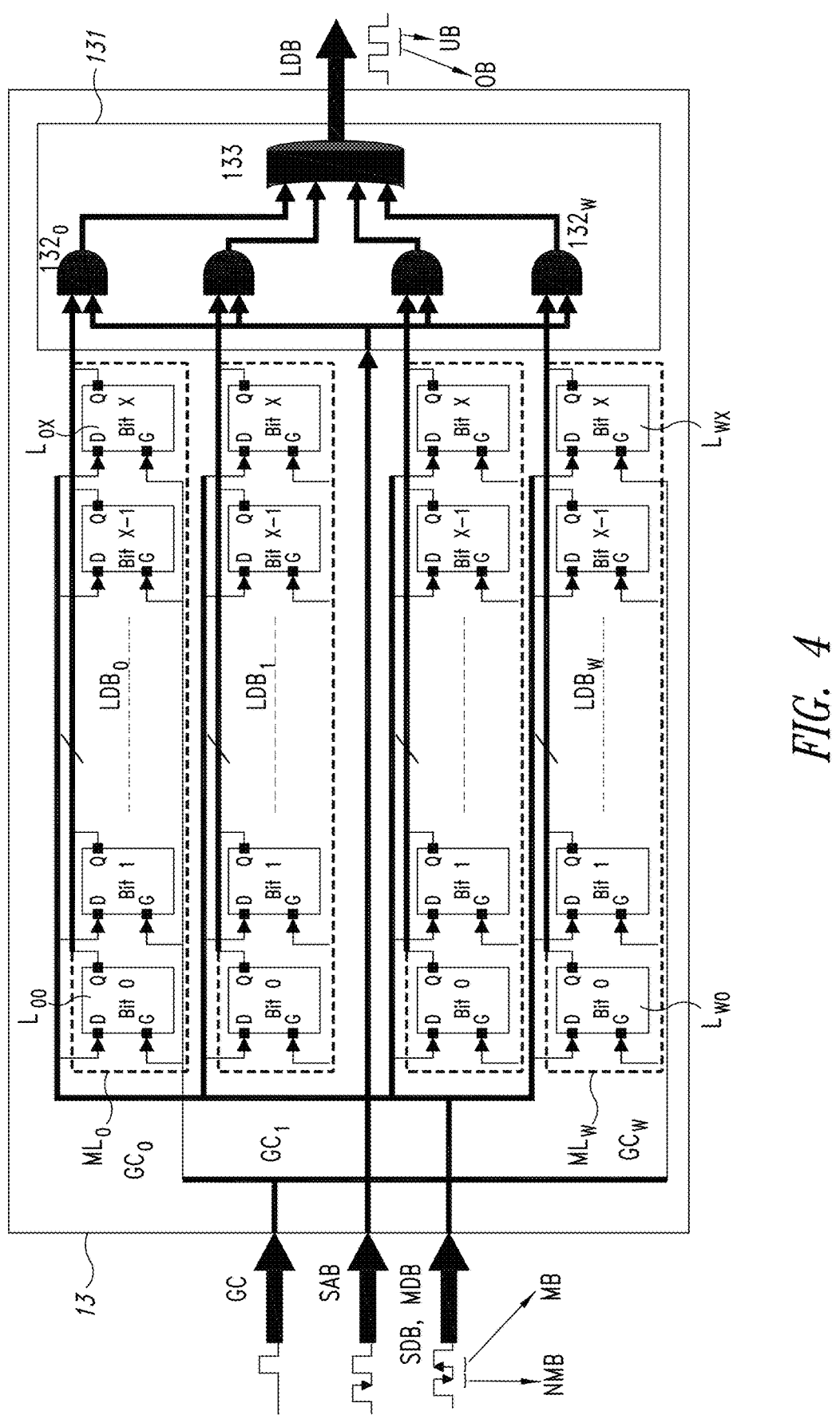
FIG. 4 shows schematically a memory matrix of said single port memory according to embodiments.

In FIG. 4 it is shown a first embodiment which comprises receiving signals GC, SAB and X+1 data bits SDB. In alternative, if in the mask block 15 masking is performed X+1 data mask bits MDB are received. The matrix 13 then comprises a matrix of latches L, organized in rows and columns. Each row of the matrix 13, corresponding to a memory location ML$_j$, corresponding to an address SAB$_j$, comprises X+1 latches L$_{j0}$ . . . L$_{jX}$, thus the matrix 13 comprises $2^{Y+1}$ rows of X+1 latches, thus a matrix of latches LL$_{00}$ . . . LL$_{WX}$. Each latch LL$_{ij}$ comprises a gated clock input G and a latch data input D, as well as a latch output Q.

Each row receives a gated clock GC$_j$ corresponding to the j-th address SAB$_j$, at its gated clock input G, while the data or masked data bits, SDB, MDB are sent to the data input D of latches LL$_{10}$ . . . LL$_{WX}$, each latch L$_{j0}$ . . . L$_{jX}$ of a row receiving at its data input D one of the bits 0 . . . X respectively of the data or masked data bits, SDB, MDB. Only the row receiving a gated clock with the positive pulse stores the SDB or MDB data. The latches with the clock pulse active update the status, while all the other keep the previous content of the data.

The outputs of the latches $L_{j0}$ . . . $L_{jX}$ of an address location $ML_j$, e.g., a row, are $X+1$ output bits which are supplied to a respective AND gate $132j$, comprised in a data selector block 131, comprising an OR-reduce architecture, which performs a logic OR with the sampled address bits bus signal SAB. Thus, there are $W+1$ AND gates $132_0$ . . . $132_W$, which outputs are sent to a multiple input OR GATE 133, which output represents the $X+1$ latch Data Bits LDB. OR-reduce is one possible architecture for this logic but also logic based on multiplexers may be used for the solution, or other logic, with the selected address location by SAB visible on latch Data Bits LDB reading the related LDB latch row.

The latch-based matrix 13 thus represents the array of memory elements, the latches $LL_{00}$ . . . $LL_{WX}$, and it is arranged so that each RAM location $ML_j$, each latch $LL_1$, has its own Gated clock signal $GC_j$ enabled in a mutually exclusive mode (one hot) as depicted in the Clock gating control logic 12 description, e.g., by the decoder 121. When the Gate clock $GC_j$ logic signal is high, the content of the related latches $L_{j0}$ . . . $L_{jX}$ is transparent, so output Q has the same value of data input D, basically the latches $L_{j0}$ . . . $L_{jX}$ behave as a buffer; when the gated clock $GC_j$ value changes, so that the input G of the latches $L_{j0}$ . . . $L_{jX}$ is changing from high to low, the data D input is sampled and stored in the latches $L_{j0}$ . . . $L_{jX}$ until input G remain low. So, the data is written or sampled in the selected RAM location, the latches $L_{j0}$ . . . $L_{jX}$, only at the falling edge of the Gated clock $GC_j$.

The data that is to be written in each RAM location $ML_j$ depends whether the RAM 10 operates or not with the mask capability.

It is here first described the simplest case, where mask capability is not used.

In this case, the Data Mask bit MDB are only coming from the FF Input sampling logic 11 and thus data are updated on the clock CLK falling edge, as shown by the arrow in the waveform of sampled address bits SAB. This means that as soon as the enabled RAM location Gated clock $GC_j$ is high, data D is stable and remains stable till when Gated clock $GC_j$ goes low (so there is no race on this signal) ensuring a clean latch output Q propagation to the output, e.g., signal LDB. The data selector 131 sub-block allows to propagate only the latch output Q of the selected location, e.g., latches $L_{j0}$ . . . $L_{jX}$, that is decoded from sampled add bits signal $SAB_j$. It does not matter whether read operation or write operation (write through capability available). The selector 131 is designed with an OR-reduce tree, in which basically all the outputs from the not selected location, e.g., different from $ML_j$, are forced low—this is obtained by the first AND stage 132—while the outputs of the selected one $ML_j$ is high, and an OR 133 among all the same bit position of all the memory locations is performed so that only the one location not forced low is propagated. Note that this is a possible solution, but also other choices might be possible to implement the selector 133, such as the use of a Multiplexer or complementary solution, such as an AND-Reduce logic architecture. The Latch Data bits output signals LDB is updated starting from clock CLK high till the clock goes low, on which the address signal SAB might change since new operation could be applied, e.g., pipeline operations.

Figure 7:
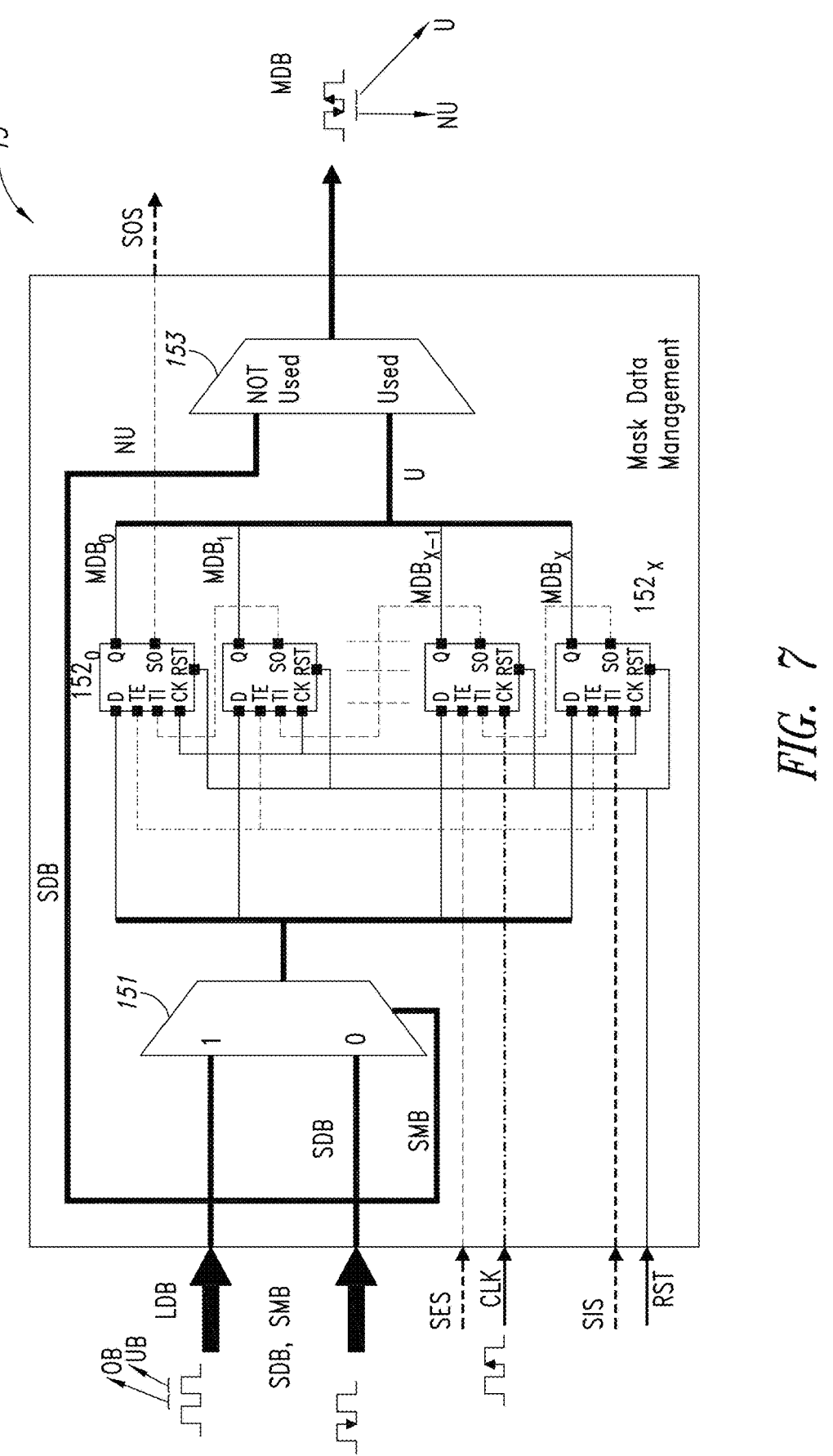
FIG. 7 shows schematically a mask data management block of said single port memory according to embodiments.

Before describing the operation of the latched matrix 13 with masking of the data bits, the mask data management block 15, shown in FIG. 7, which is an optional block, to manage Mask capability, is described.

The mask data management block 15 includes a two-way multiplexer 151, with $X+1$ outputs, receiving on one input the Latch Data bits output signals LDB and on the other the Sampled Data Bits SDB, while the sampled mask bits SMB are supplied as selection signal of the multiplexer 151. The $X+1$ outputs of the multiplexer 151 are supplied to the data input of respective $X+1$ flip flops 152 which are also scan ready flip flops with the already described inputs and outputs. The data output of the $X+1$ flip flops 152 are brought on a mask used path U to an output "Mask Bypass feature" multiplexer 153, which receives on a mask not used NU input path the Sampled Data Bits SDB directly from the input of the block 15.

In case the masking feature is not used, e.g., mask not used NU path, the overall behavior is equivalent to have the "Mask Bypass feature" multiplexer 153 in the mask "NOT used" configuration, e.g., allowing the NU path as output. In such a way the Output Data Mask bits MDB are fully coming from the FF input sampling logic 11—as Sampled Data bits SDB—and are updated on the clock CLK falling edge (as shown in the SDB waveform) while if the configuration is to use mask capability (thus mask "Used" path U is selected) the data are coming from the output Q pin of the internal flip flops $152_0$ . . . $152_X$.

These flip flops $152_0$ . . . $152_X$ are sampled on the clock rising edge and the data content depends on the status of the Mask Input multiplexer 151 ($X+1$ 2-way Mux).

For the bits that are not masked (so bit on which the Sampled Mask bits are not active, multiplexer 151 value equivalent to 0 in this example) the data at the data input D of flip flops $152_0$ . . . $152_X$ are coming from Sample Data bits bus SDB. This means that the Output Mask Data Bits linked to these NOT masked bits will reflect the content of the RAM Boundary Input Data bit that need to be written in the specific bit location.

For the bits that are masked (so bit on which the Sampled Mask bits are active, multiplexer 151 value equivalent to 1 in this example), the data at the data input D of flip flops $152_0$ . . . $152_X$ are coming from Latch Data Bits bus LDB generated inside of the Latch Matrix 13. This bus, as indicated above, has the content of selected location (Older data bits OB before any write operation, while UB indicates updated bits, only in write mode) stable and equivalent to previous data till clock CLK rising edge and so the content of the re-sampling flip flop on the rising edge allows to maintain this status since the RAM matrix 13 block writing operation is performed on the clock falling edge (when the Gated clock $GC_j$ goes from high to low logic level). In other words, the latches $LL_{j0}$-$LL_{jX}$ are transparent starting on the clock rising edge but since the Mask Data Bits MDB change on this edge and the sampling in the latch is performed at the clock falling edge, the overall write operation happens on CLK falling edge when data is stable. This allows to maintain the status of masked location bits.

Thus, coming back to the operation of the matrix 13, if the masking of data bits is applied, the data of all the bit are re-sampled on the rising edge inside of the Mask Data block 15, as shown in the MDB waveform, indicate with the same U for used path, so same edge in which the selected RAM location latch becomes transparent.

This means that the Output Latch Data bits LDB maintain for the low CLK stage (Marked as "older data bits" OB) the previous status (filled by a previous operation on the location) until clock rising edge which is "updated" only on the rising edge of the clock. But as it is evident in the Mask data management block 15, the resampling of these masked signals with previous data prevents to have any change in the status of the masked bits MDB, so in the end the writing operation is masked, and same data will be written as previous one stored in such a bit location, and instead to write the NOT masked bits with the data coming from the FF input sampling logic.

Figure 5:
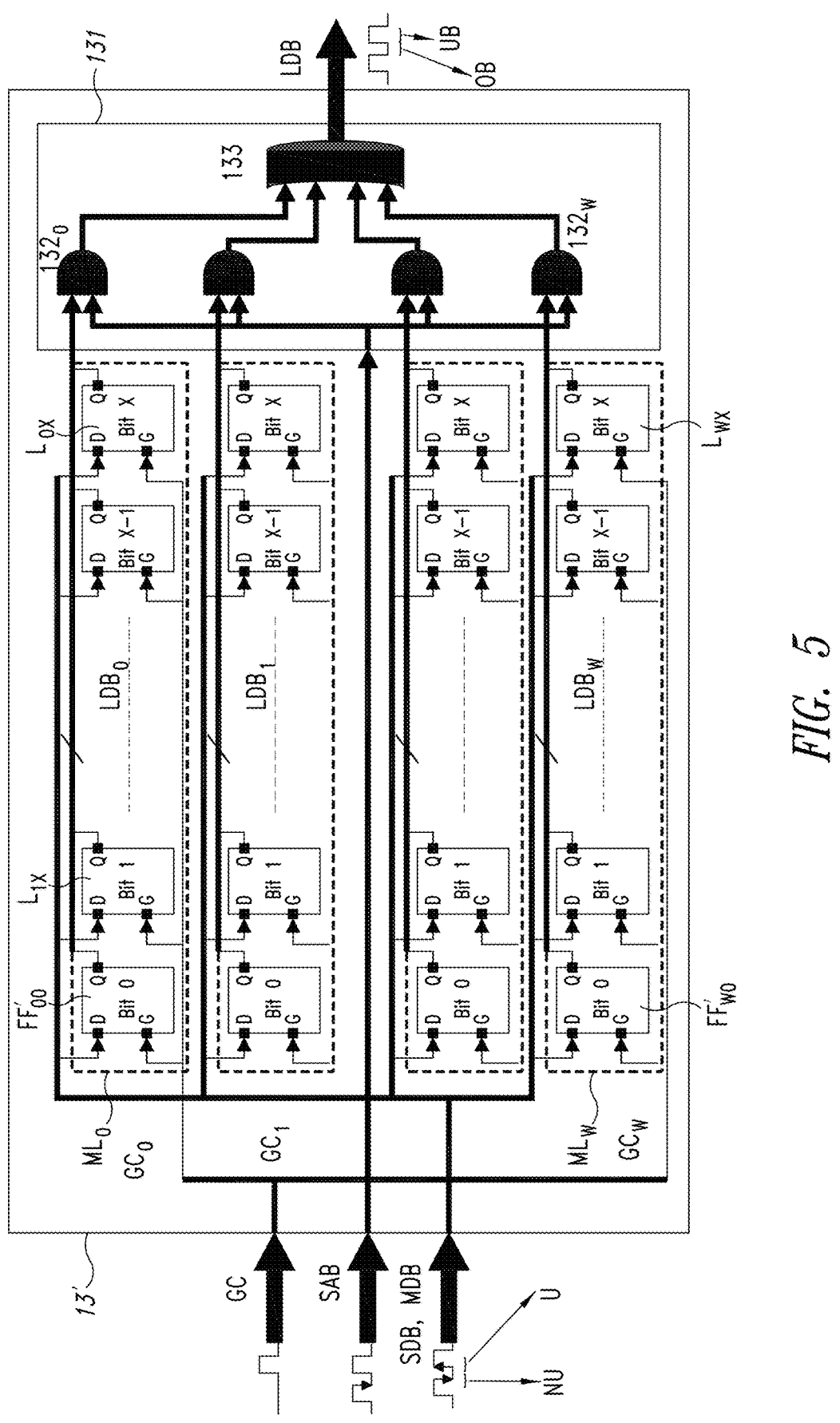
FIG. 5 shows schematically a second embodiment of the memory matrix of FIG. 4.

In FIG. 5 it is shown a second embodiment, indicate with the reference 13', of the latch matrix according to the solution here described. Analogous or corresponding elements with respect to FIG. 4 are indicated by the same reference. Such second embodiment 13' differs in that the element storing the bit 0 of each Ram Address location $ML_j$, e.g., of each row, which is embodied a latch in the matrix 13 of FIG. 4, is replaced here by a respective flip flop $FF'_{00} \ldots FF'_{W0}$. The gated clock GC, is brought to a clock input CP of the flip flops $FF'_{00} \ldots FF'_{W0}$. In further variant embodiments, any i-th bits, from 0 to X, of the rows, or memory locations $ML_j$, j from 0 to W, can be selected to replace the column of latches $L_{0i} \ldots L_{Wi}$ with a column of flip-flops $FF'_{0i} \ldots FF'_{Wi}$.

This embodiment of the matrix 13' improves the capability of ATPG (Automatic Test Pattern Generation) to detect defect allowing to increase Coverage (which may be for instance a mandatory aspect especially in Automotive segment). This is because some faults in the clock gate control structure might be not detected with the latch matrix 13 of FIG. 4.

This embodiment however may operate only when the Mask bit option is not used and it may represent the best trade-off between Max Coverage requirements and area overhead.

Figure 6:
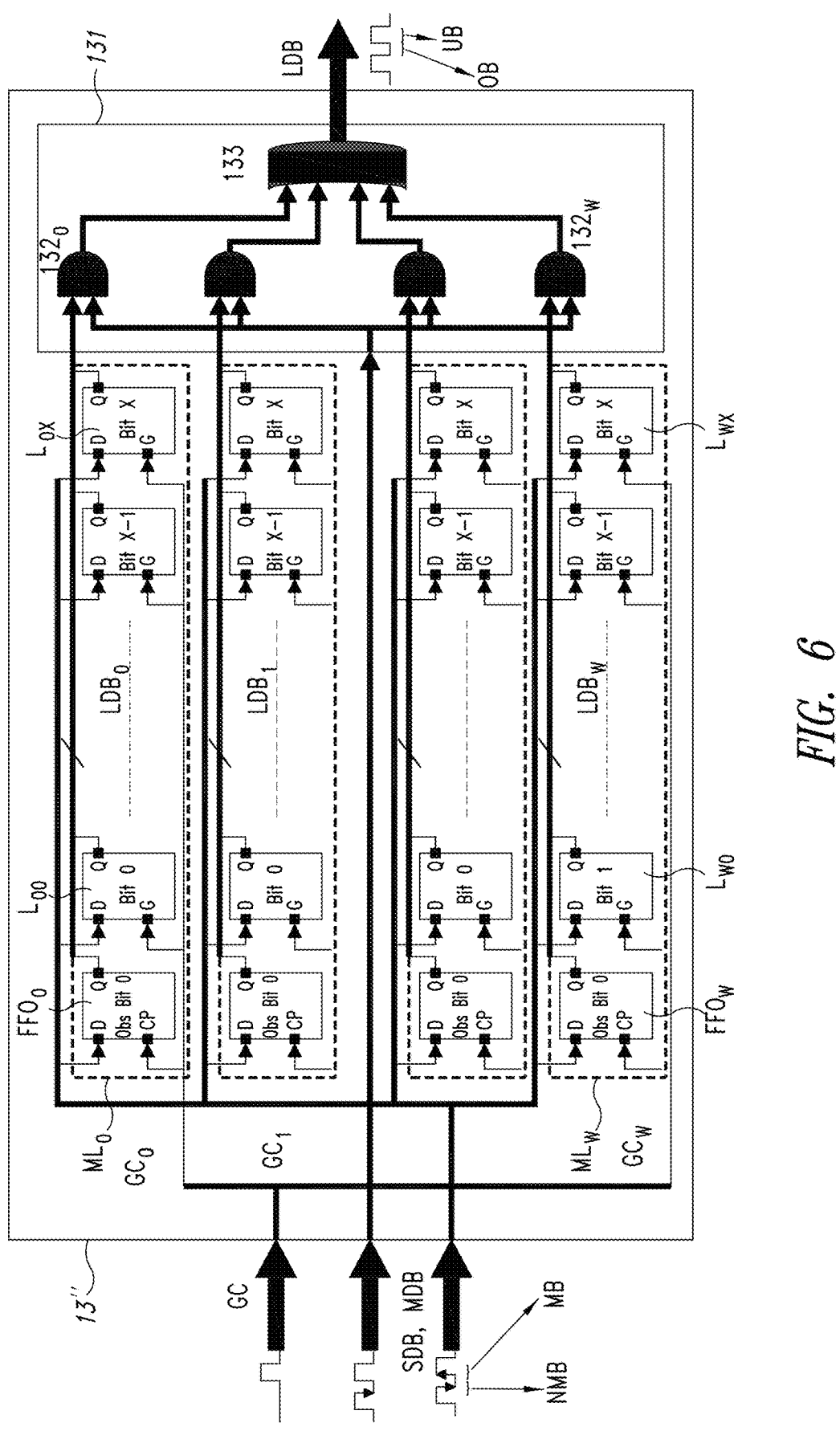
FIG. 6 shows schematically a third embodiment of the memory matrix of FIG. 4.

In FIG. 6 it is shown a third embodiment 13" of the latch matrix according to the solution here described. Analogous or corresponding elements with respect to FIGS. 4 and 5 are indicated by the same reference. This third embodiments 13" differs in that on top of a latch matrix corresponding to the latch matrix 13 of FIG. 4, including latches in row and columns $L_{00} \ldots L_{WX}$, flip flops $FFO_0 \ldots FFO_W$ are added at the beginning of the row representing each RAM location $ML_j$. These flip flops $FFO_0 \ldots FFO_W$ are not used in functional mode, normal operation, but are added just to improve the capability of ATPG (Automatic Test Pattern Generation) to detect defects.

This solution can be used also with Mask capability, although it may be that when Mask capability is used coverage is already near to 100%, thus it is not necessary while the embodiment results less area efficient in case of no mask capability with respect to the embodiment of FIG. 5.

Figure 8:
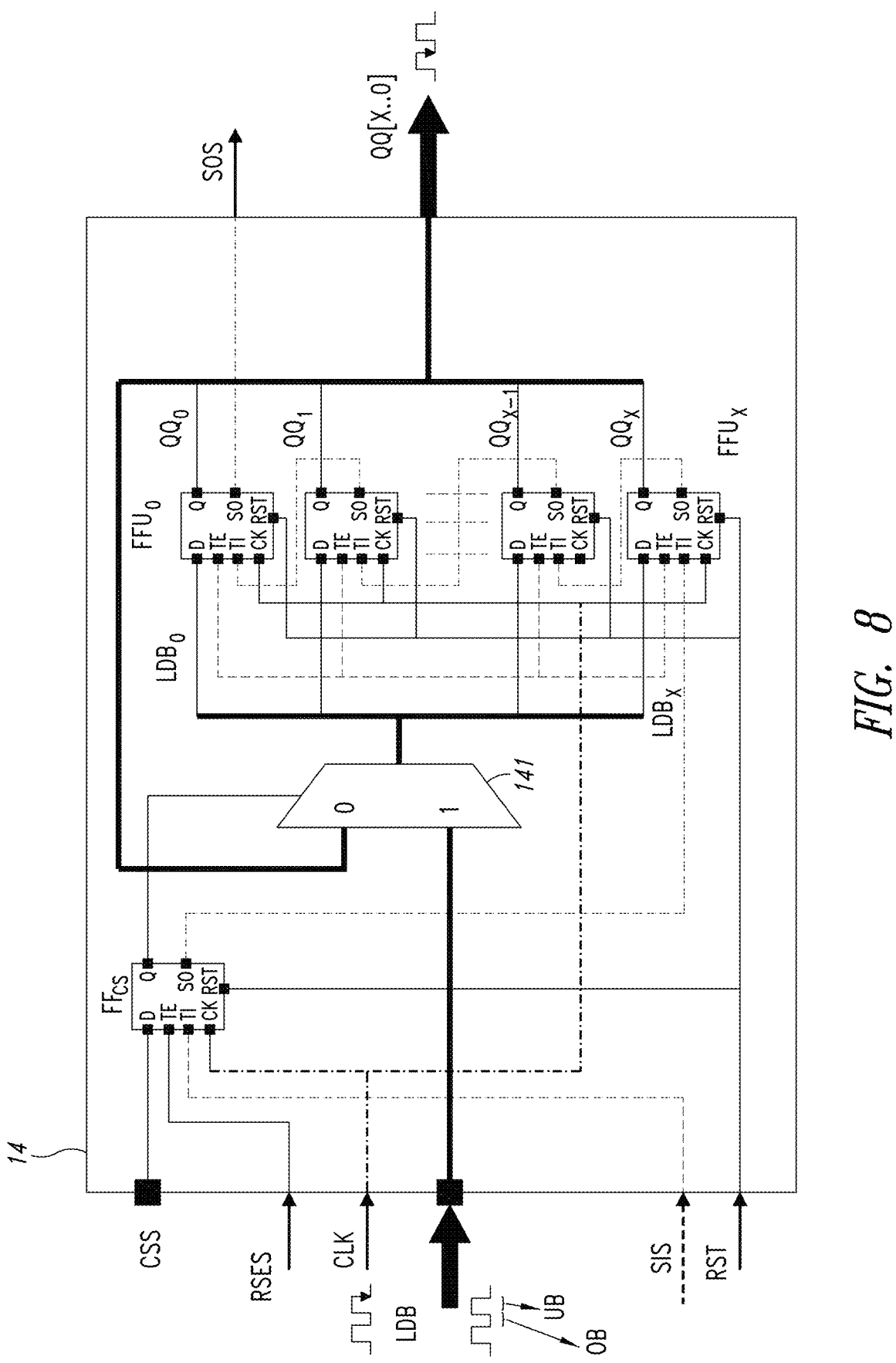
FIG. 8 shows schematically an output sampling logic said single port memory according to embodiments.

In FIG. 8 it is shown an embodiment of the FF output sampling logic 14, which is configured to decouple the outside output device logic with respect to the internal one.

The Latch Data Bits signal LDB is sent to an input of a two inputs multiplexer 141, which at the other input receives as feedback from the output an output bus QQ[X . . . 0] which is the memory output and output of the block 14. The multiplexer 141 receives as selection signal the output of a chip select flip flop $FF_{CS}$, which at its data input receives the chip select signal CSS. In the example shown the multiplexer 141 selects the Latch Data Bits signal LDB if the selection signal from chip select flip flop $FF_{CS}$ is logic one. The bit 0 . . . X of the Latch Data Bits signal LDB are sent to the data inputs of respective output sampling flip flops $FFU_0 \ldots FFU_X$ which receive on their clock input CK the clock CLK. The output bus QQ[X . . . 0] is the memory output and is connected to the outputs Q of the output sampling flip flops $FFU_0 \ldots FFU_X$. The content of these output sampling flip flops $FFU_0 \ldots FFU_X$ is updated on the clock CLK falling edge only when the sampled Chip_selection signals (in the chip sel flip flop $FF_{CS}$) is active, logic value one as indicated, while maintain the status when not active, by selecting the output bus QQ[X . . . 0] fed back at the input of the multiplexer 141, in this example the value of the selections signal is logic zero.

The data sampled in such output sampling flip flops $FFU_0 \ldots FFU_X$ when Chip Selection CSS is active are coming from the Latch Data bit bus LDB and are stable on the clock falling edge and aligned with the Updated Data bits UB, indicated in the corresponding waveform at the same input, ensuring in such a way to show on the output Q of flip flops $FFU_0 \ldots FFU_X$ the new read data (when the read operation is performed) or the write through data (when the write operation is performed).

Thus, it is here described a Random Access Memory comprising an array 13, 13', 13" of storage elements arranged in rows and columns, the rows of storage elements identifying respective memory locations, wherein said array of storage elements comprises an array of delay type latches $L_{00} \ldots L_{WX}$, receiving at their data input, D, bits of the data to be stored, e.g., sampled data bus, SDB, and at their clock input, CK, a gated clock signal $GC_j$, corresponding to the memory location $ML_j$ to which they belong.

Then, variant embodiments may envisage that a column in said array of D type latches $L_{00} \ldots L_{WX}$ comprise D scan ready flip flops in place of D type latches or a column of D flip flops is added to said array of D type latches $L_{10} \ldots L_{WX}$.

The outputs of the latches $L_{00} \ldots L_{WX}$ of an address location $ML_j$ are supplied to a data selector block 131 selecting latch Data Bits LDB corresponding to the address bits bus signal SAB, e.g., address the signal being currently asserted.

Then, the random address memory 10 comprise a clock input logic 12 configured to provide respective gated clocks $GC_j$ for each memory location $ML_j$ in the array of D type latches $L_{00} \ldots L_{WX}$ said clock input logic 12 comprising:

a one hot decoder configured to perform a one hot decoding 121 on the bus of sampled address bits SAB obtaining one hot format addresses $DAB_j$, index j varying from 0 to $W=2^{Y+1}-1$; and clock gating cells 123j configured to perform a gating of the clock CLK with the one hot format addresses $DAB_j$, in particular by coupling the one hot format addresses $DAB_j$ and the clock CLK to the input of respective OR gates 125j outputting respective gated clocks $GC_j$ obtaining respective gated clocks $GC_j$.

Figure 9:
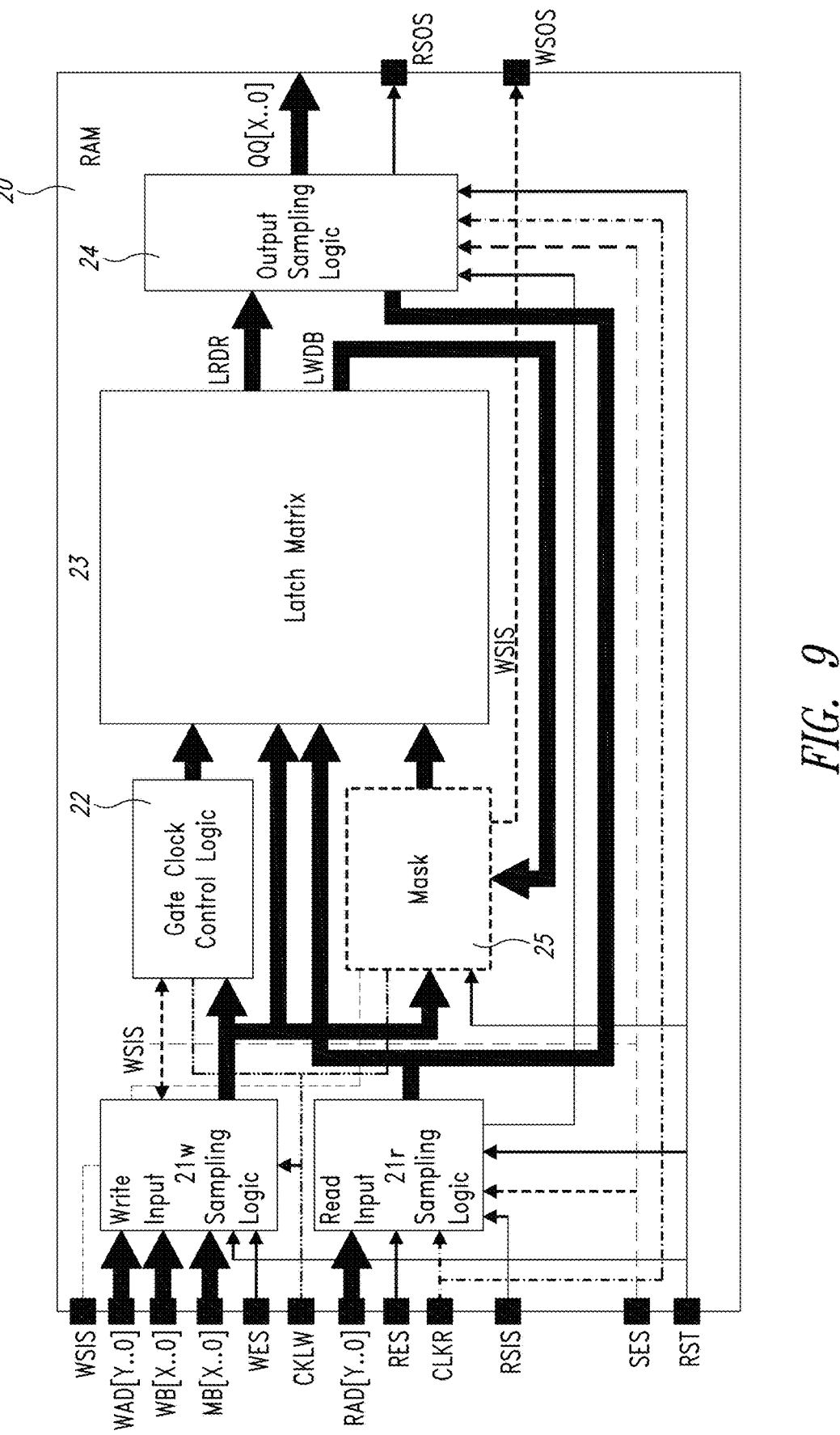
FIG. 9 shows schematically a dual port memory according to embodiments.

In FIG. 9 it is shown a second embodiment here described with dual port architecture RAM memory, indicated as whole with the reference number 20.

The Dual Port RAM is an extension of the Single Port RAM, therefore in general only the differences vs the Single Port RAM 10 will be described in detail here below.

As it is known in the field, the Dual Port RAM differs from the Single-Port RAM since read and write operations can be performed concurrently on the Dual Port RAM with the restriction that they cannot access the same address at the same time, while these operations, read and write, are mutually exclusive in the Single Port RAM (with the exception of writethrough feature in which the written data is transferred on the output, but this is not a "real" read operation since the write enable signal is in write mode).

As shown in FIG. 9 the Dual port RAM 20 receives input boundary signals a part of which corresponds basically to those received at the RAM 10, e.g., a write address bus signal WAD[0 . . . Y] is received corresponding to the address bus AD[0 . . . Y], a write data bus WB[0 . . . X], a mask bus MB[0 . . . X], a write clock signal CLKW, which performs a function analogous to signal CLK of the RAM 10 when operating as write clock (CLK it is as well as read clock since it clocks the flip-flops output sampling logic 14), a write enable signal WES, a write scan in signal WSIS, analogous to signals SIS in RAM 10, a scan enable signal SES, a reset signal RST. The input boundary however further includes a set of read signals, e.g., a read address bus signal RAD[0 . . . Y], a bus of Y+1 bits containing the read addresses, a read enable signal RES, enabling reading operations, a read clock signal CLKR clocking read operations, a read Scan In signal RSIS to implement the ATPG scan chain for read operations.

As shown in FIG. 9 the Dual Port RAM 20 includes splitting the input sampling logic into a write input sampling logic 21w and a read sampling input sampling logic 21r, which respectively manage the control logic for writing and reading operation in a separate manner.

Figure 10:
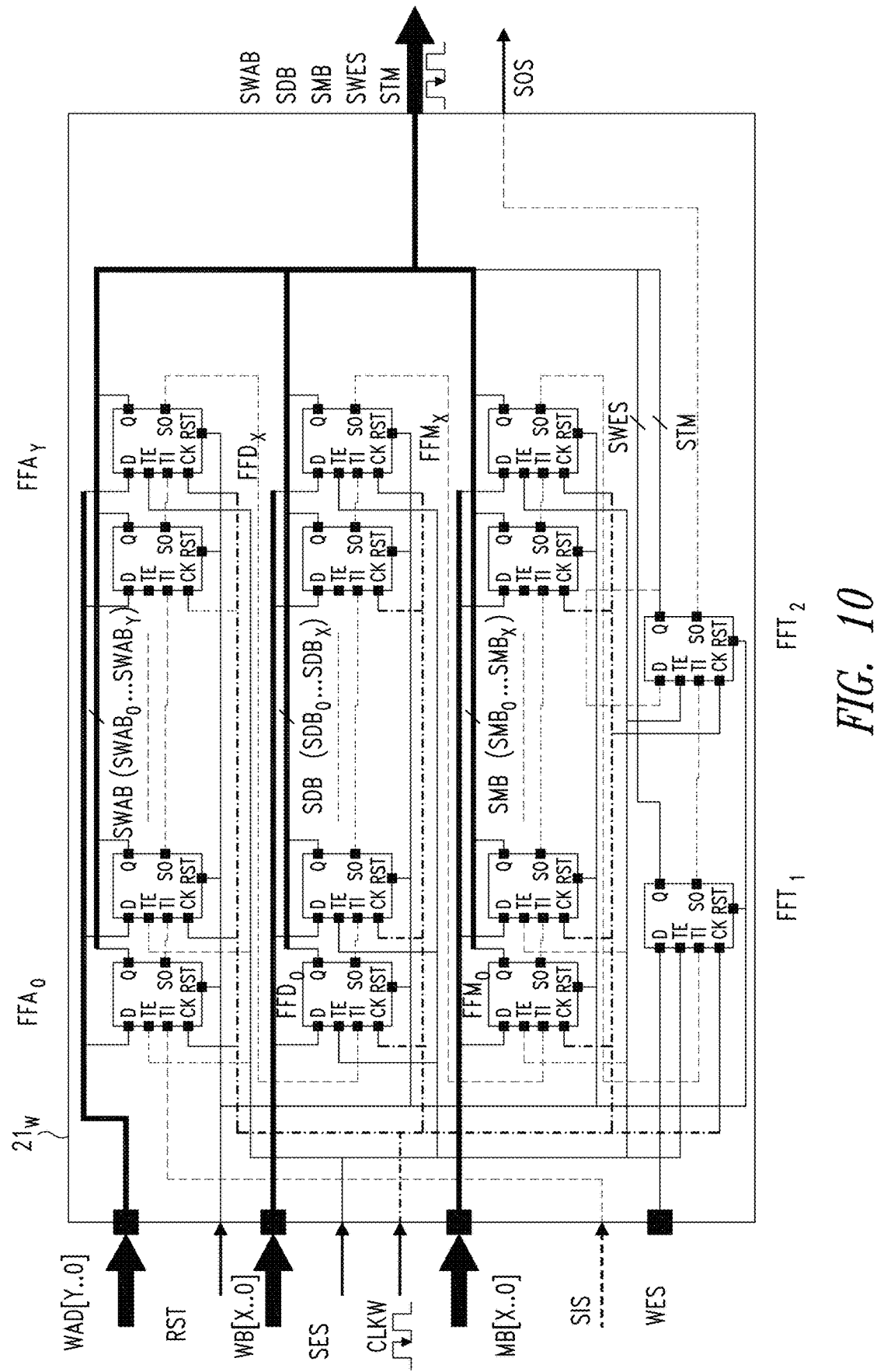
FIG. 10 shows schematically a write input sampling of logic of said dual port memory according to embodiments.

As shown, in FIG. 10, which shows the write input sampling logic 21w, such write input sampling logic 21w corresponds to the input sampling logic 11, which is also for writing, e.g., it has the same architecture, components, and input and output signals, although here some are labelled as "write" signals, e.g., write clock signal CLKW and write address WAD. It is noted that in this case there is a difference between the write input sampling logic 21w and the input sampling logic 11, since chip select signal CSS is no longer available. Thus the first test flip flop FFT1 receives the Write Enable signal WES signal (no AND 111) outputting a Sampled Write Enable signal SWES which is simply a resampling the signal WES.

Figure 11:
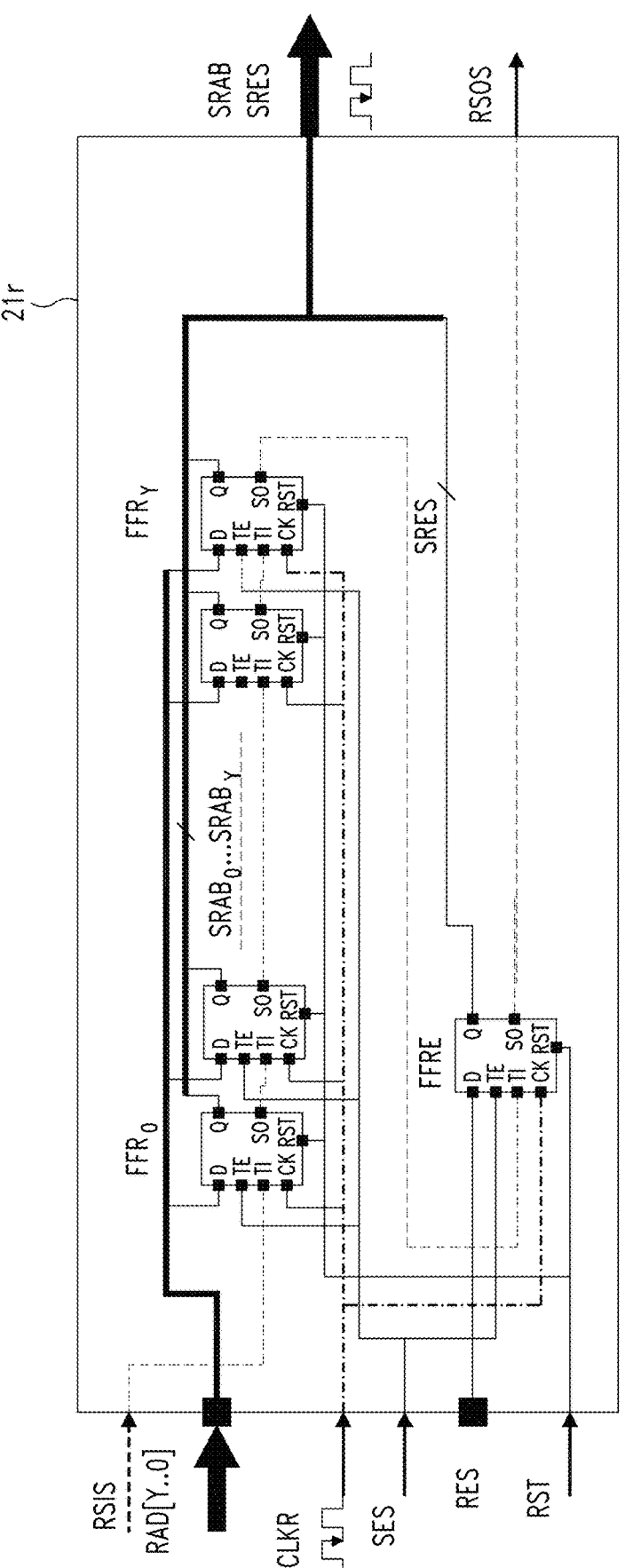
FIG. 11 shows schematically a read input sampling of logic of said dual port memory according to embodiments.

In FIG. 11 it is the shown the read input sampling logic 21r which receives the read address bus signal RAD [Y . . . 0], the read clock CLKR, the read Scan In Signal RSIS, the Read enable signal RES.

Then the block 21r comprises a row of address resampling delay flip flops $FFR_0$ . . . $FFR_Y$, all scan ready flip flops also in this case, receiving the read address bus signal RAD[Y . . . 0], each flip-flop receiving a bit of the read address bus signal RAD[Y . . . 0] and resampling it with the read clock signal CLKR to produce respective sampled read address bits SRAB as output of block 21r.

Another output of block 21r is a sampled read enable SRES, sampled with the read clock signal CLKR in a further scan ready flip flop FFRE, which samples the Read Enable signal RES. The reset signal RST is supplied to all the reset input of the flip flops, while the Scan In read Signal RSIS is brought to the TI input of the first flip FFR0, while its output SO is coupled to the TI input of the following flip flop, and so on, this being exemplary of a possible way according to which the flip flops are cascaded with respect to the scan in signal RSIS, e.g., a possible implementation of a scan daisy chain, although other implementations are possible. The last flip-flop of the chain is the further scan ready flip flop FFRE, which receives the output SO of the last address resampling delay flip flop $FFR_Y$ and outputs the Scan out signal RSOS from its output SO.

Figure 12:
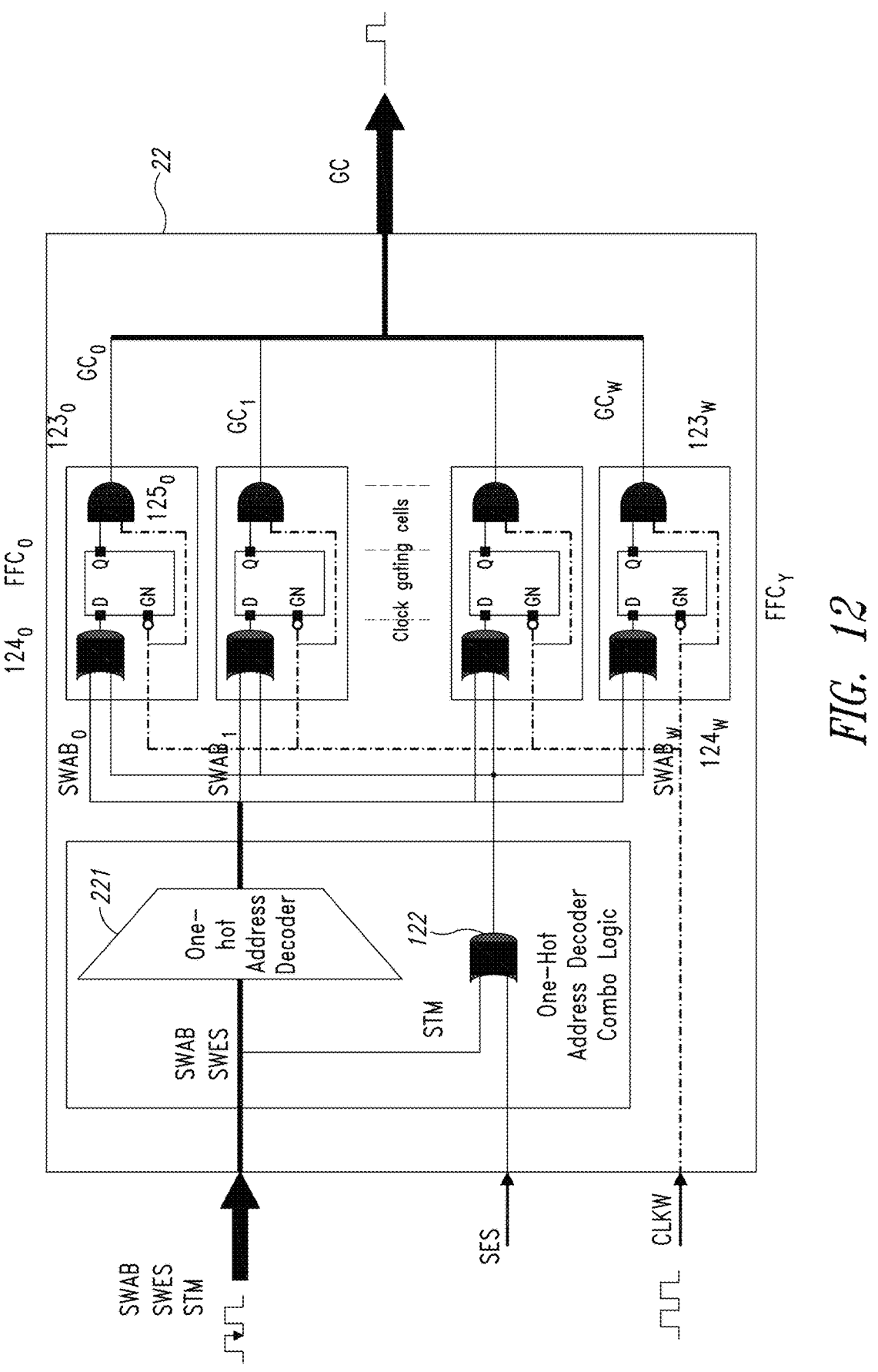
FIG. 12 shows schematically a clock gate control logic of said dual port memory according to embodiments.

In FIG. 12 it is shown the clock input logic 22 which has the same architecture of the clock input logic 12, used in the Single port RAM 10, only receives as clock the write clock signal CLKW, while receives instead of the Sampled Add bits SAB the Sampled Write Add bits SWAB, although both in RAM 10 and 20 these signals refer to write operations. As mentioned, the signals, besides the write label, correspond to the signals CLK and SAB of FIG. 3. The other signals and components in the block 22 are indicated by the same references, as they are obtained from signals which are analogous to that of FIG. 3, but are used only in write mode, in particular the gated clocks GC at the output. As mentioned, the Sampled Write Enable signal SWES is a sampled version of the Write Enable signal WES in this case.

Figure 13:
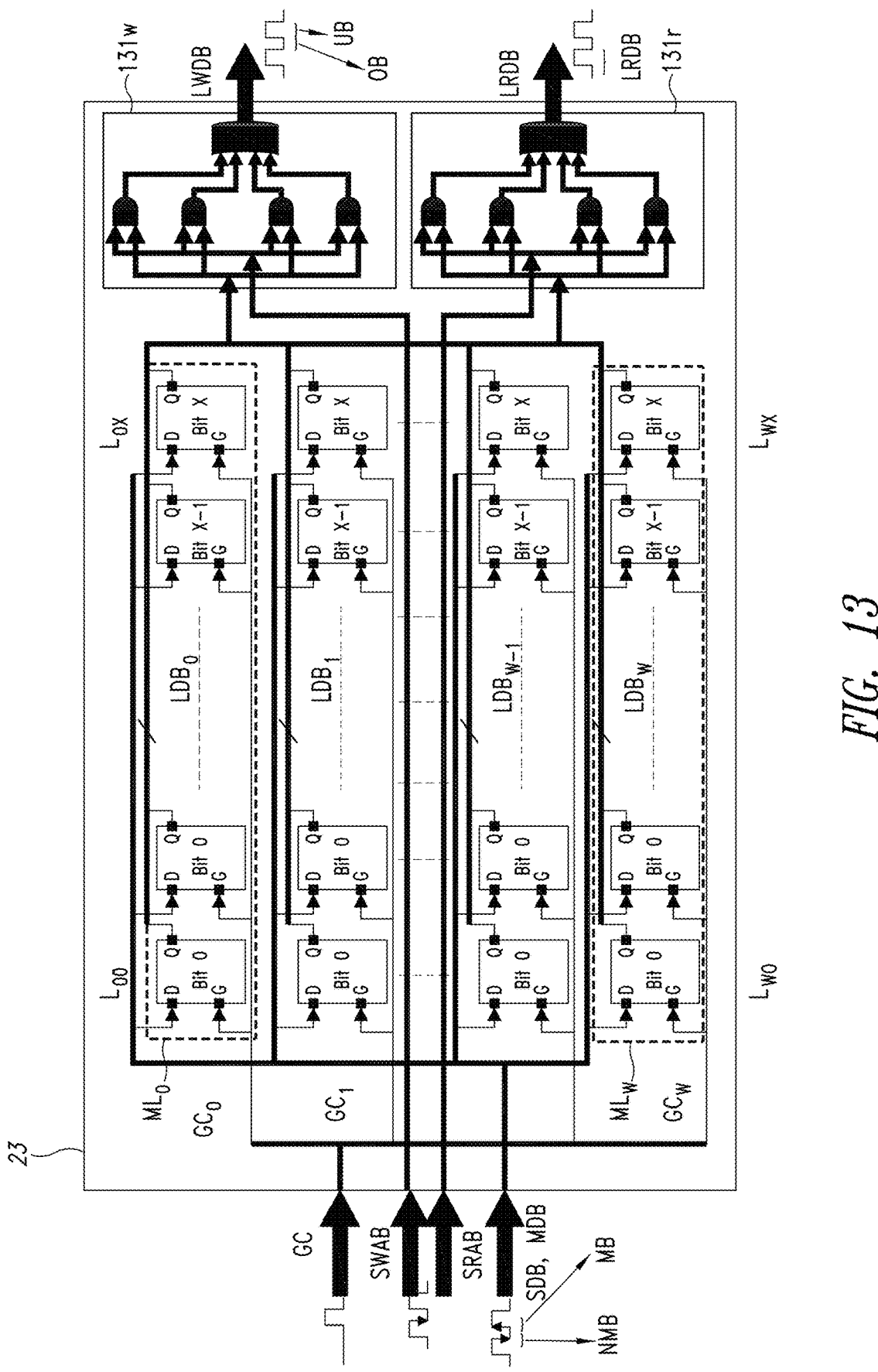
FIG. 13 shows schematically a memory matrix of said dual port memory according to embodiments.

In FIG. 13 it shown the latched matrix 23, which is shown, with respect to the single matrix 13 as receiving, in addition to gated clock signals GC, Sampled Write Add bits SWAB (in particular, which replace Address bits SAB for the write function in this embodiment), Sampled Data bits SDB and Masked Data bits MDB, regarding the write mode. Also, Sample read address bits, which are used in the read mode, are indicated with SRAB.

The latched matrix 23 includes a matrix of latches corresponding to that of the matrix 13, e.g., a matrix of latches in row and columns $L_{00}$ . . . $L_{WX}$ coupled to a read data selector 131r, like the selector 131 in the matrix 13, for the read operations, which provides as output X+1 latch read data bits LRDB (corresponding to latch data bits LDB in FIG. 4). However, an optional write data selector 131w is provided for the masking capability, this meaning that is optional if no masking is used, which provides as output X+1 Latch Write Data Bits LWDB. The architecture of these two data selector blocks 131r and 131w is the same as the one of block 131 for the single port RAM 10, the only difference being that instead of the Sampled Address Bits SAB one, write data selector blocks 131w, which is optional, receives the Write Address Bus signal SWAB input, in particular as the input of the AND gates 132, described in FIG. 4, receiving at the other input of the AND gates 132 the content of the corresponding memory locations, the other read data selector blocks 131r receives instead the read address bus signal SRAB in particular as the input of the AND gates 132, described in FIG. 4, receiving at the other input of the AND gates 132 the content of the corresponding memory locations.

Figure 14:
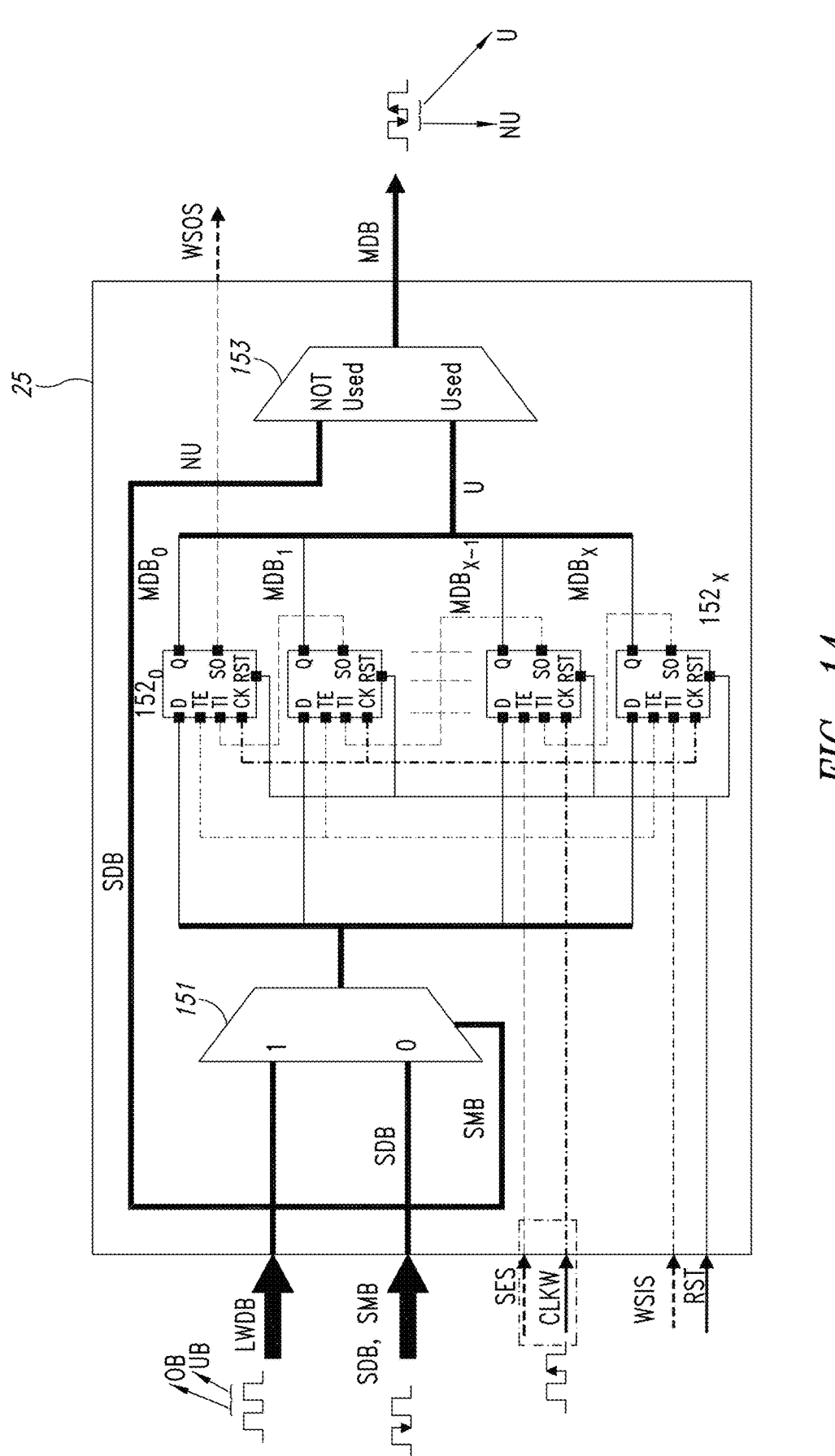
FIG. 14 shows schematically a mask data management block of said dual port memory according to embodiments.

In FIG. 14 it is shown the masking block 25 which correspond to the block 15 shown in FIG. 7. Only, instead of the signal Latch Data Bits LDB, the block 25 receives as input, fed back from the output of the matrix 23, the latch write data bits LWDB, outputted by the optional data selector 131w, then also receives the same single port input signals, SDB, SMB, SES, RST, while the clock signal fed to the block masking 25 is the write clock signal CKLW. At the output of a mask bypass multiplexer 153 corresponding to the one of block 15 the masked data bits MDB are output.

Figure 15:
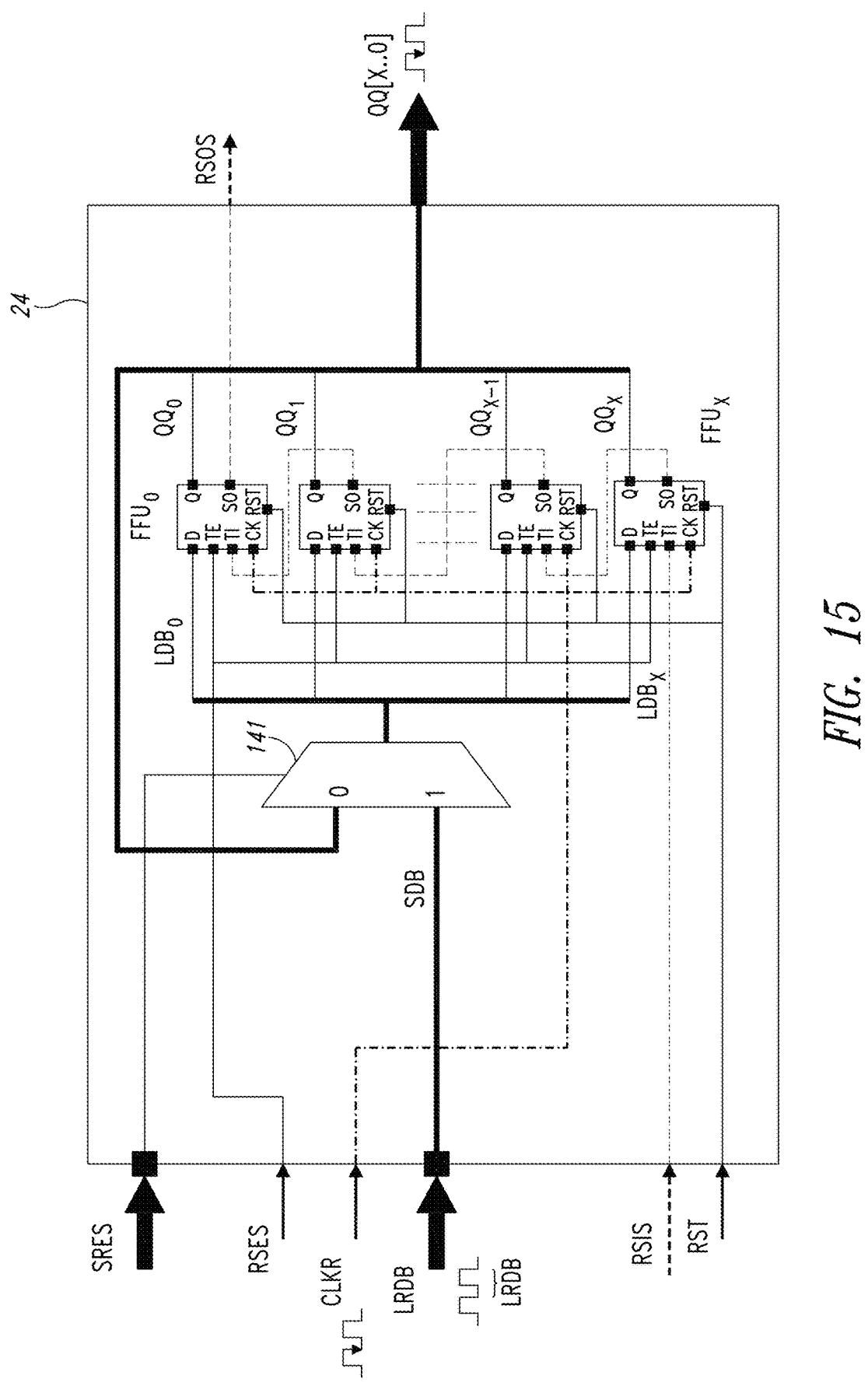
FIG. 15 shows schematically an output sampling logic of said dual port memory according to embodiments.

Finally, in FIG. 15 it is shown the output sampling logic 24, which corresponds to the block 14 of FIG. 8, the only difference with respect to signals, being that receives, instead of the latch data bit LDB, the latch read data bit LRDB as input. Then, the clock signal received by the block 24 is the read clock signal CLKR. Like for block 14 sampled scan enable SES and scan in signal RSIS are also provided, as well as the reset signal RST. Also, in such read version 24, the read operation is controlled directly by the Sampled Read Enable signal SRES coming from the FF input Read sampling logic 21r, which represent here the selection signal of the multiplexer 141 directly, without being combined with the chip select signal CSS in a specific flip flop like in block 14, e.g., the logic 24 does not comprise the flip flop $FF_{CS}$. These changes are made since this block is active only when Read mode is performed. Besides this difference the architecture is the same of block 14, finally outputting the output signal QQ, which contains the read data, sampled with the read clock CLKR.

As mentioned above, the Single Port RAM 10 or Dual Port RAM 20 may operate with rising edges instead that with falling edges.

With reference to the Single Port RAM 10 of FIG. 1, for instance, there is a limited number of modifications which may be implemented in order to have a Single Port RAM memory working on the falling edge, as described in the detail previously, or, respectively, on the rising edge.

For the blocks Flip-Flop Input sampling logic 11, and Flip-Flop Output sampling logic 14 it is sufficient, instead of having the corresponding Flip-Flops sampled on the clock falling edge, to change the edge from falling to rising. Accordingly the optional Mask data Management 15 changes instead sampling from rising edge to falling edge. It is specified to this regard that for clock CLK in the memory 10 (or 20) sampled on the falling edge or respectively rising edge, is intended the sampling performed on Flip-Flop Input sampling logic 11, and Flip-Flop Output sampling logic 14.

Regarding the latch-based matrix 13, the modifications affect latches $LL_{00}$ . . . $LL_{WX}$ of the matrix. The latches transparent on positive, or high, clock (identified with gated clock input G of the latches in FIG. 4) may be replaced with latches transparent when the clock signal at the gated clock input G is low, e.g., they are the same type of the latches FFC in FIG. 3 which receive at its clock input GN the negated of the clock CLK. Also the gated clock signals $GC_0$ . . . $GC_W$ clocks are different. In particular, they are pulsed high when there is a falling edge in the clock of the Flip-Flop Input sampling logic 11 and Flip-Flop Output sampling logic 15 and pulsed low (as shown in FIG. 16 as described in the following) when there is a rising edge.

Figure 16:
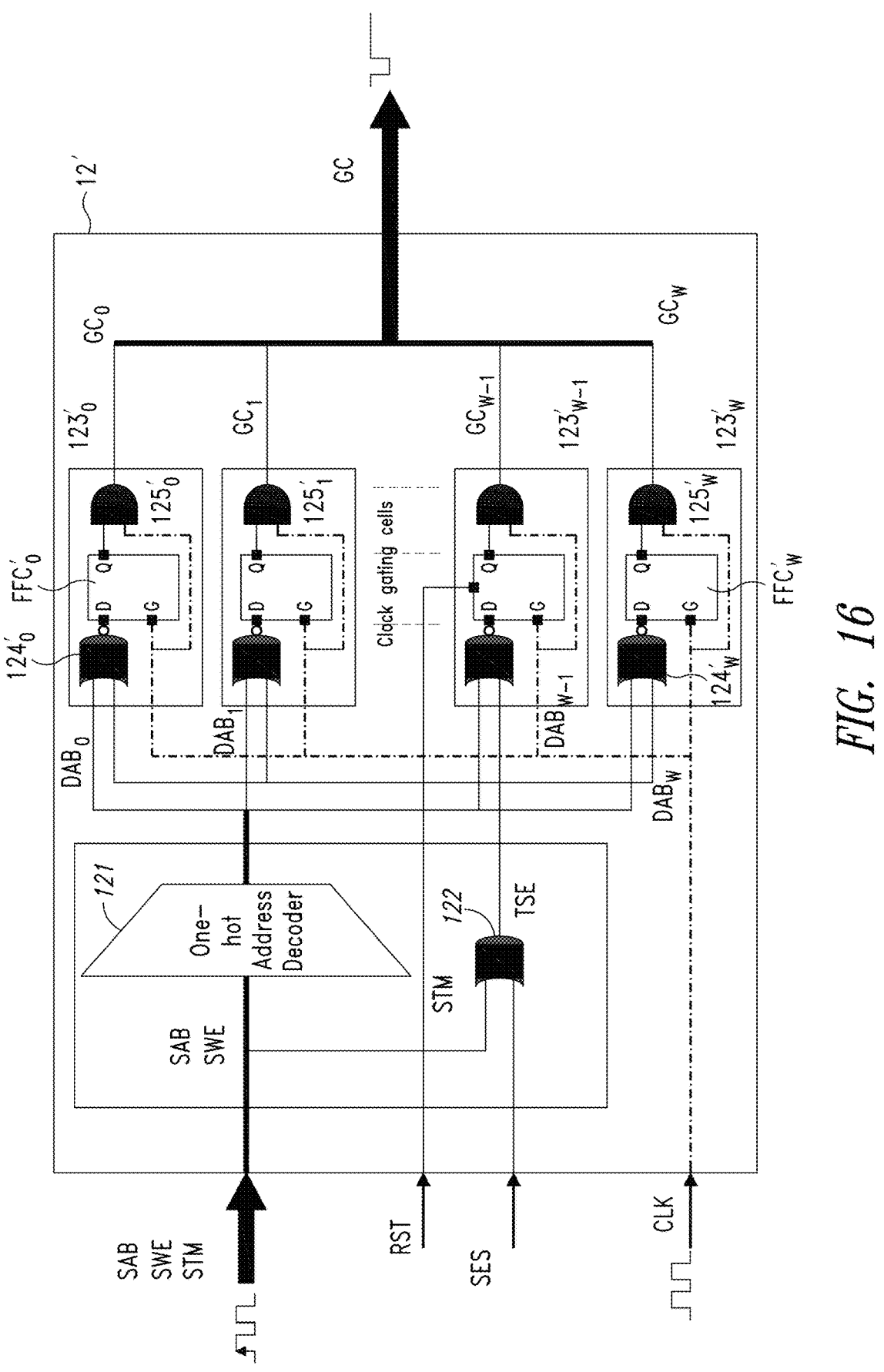
FIG. 16 shows schematically clock gate control logic of said single port memory according to embodiments.

The clock gate control logic 12 has additional modification, in addition to the change of the edge of the clock, as indicated in FIG. 16, which show a variant clock gate control logic 12' operating with rising edge of the clock CLK.

The modifications to the clock gate control logic 12' shown in FIG. 16 in this case are of two types: the edge of the boundary signals, which for input signals SAB/SWE/STM has sampling on the rising edge as better detailed below, and the one related to the clock gating cells indicated as 123 in FIG. 3.

In particular, with respect to the specific implementation shown in FIG. 3 of the clock gating cells 123, the clock gate control logic 12' uses clock gating cells 123' where: OR gates 124 in the implementation with falling edge of FIG. 3 are changed to a NOR gates 124';

cell latches $FFC_j$, which were latches transparent on clock low (identified with clock input GN) in the embodiment of FIG. 3 are replaced with latches $FFC'_j$ transparent on clock high (clock input G, as in the latches of the array 13); and AND gates 125*j* which were an AND in the embodiment of FIG. 3 are changed to OR gates 125'$_j$.

In general, clock gating cells 123, which are able to manage propagate positive pulse, e.g., at high logic level, for sampling on the falling edge, are changed, for sampling on the rising edge, to clock gating cells 123' able to manage the propagation of negative pulse, e.g., at low logic level, as mentioned above.

Also in this case the implementation of the clock gating cell 123' is one of many possible, it is relevant that the clock gating cell 123' is configured to propagate negative pulses.

It has to be noted that the signal of reset RST can be also act as a set for the latches $FFC_j$, e.g., sent to its SET input.

In FIG. 16 this is shown only for latch $FFC_{W-1}$, for simplicity. This might prevent X propagation at the begin if the clock CLK has off-state low.

Regarding the edge of the boundary signals, then FIG. 16 shows thus the edge clock on address signal SAB, sampled write enable signal SWE and STM signals with the arrow on the rising edge of the clock, thus gated clock signals GC happen to be at low logic level only when the clock CLK is at low logic level also because there is an OR (125 which requires both the input low) to have output low.

Thus, the advantages of example embodiments the solution described hereabove are clear.

Management of Small size RAMs (both Single than Dual Port with or without mask capability) is difficult since to grant the very high Automotive quality (normally <1 ppm), dedicated Built-In Self-Test (BIST) logic need to be adopted. This obliges to integrate many BIST blocks in the device increasing the overall DFT management complexity, other than the overall device area. The solution described allows to reduce, depending on the cut size, the overall area compared with the RAM solutions plus BIST circuits, to have minimal impact on the overall device complexity ensuring to target the Automotive grade quality requirements.

More in detail, the solution described thus allows advantageously to obtain an RTL Scalable solution on functionality (mask or no-mask writing capability) and on target Fault Coverage. The solution described can obtain till 50% area reduction with respect to a full Flip-Flop matrix implementation. Depending on cut size, it is also smaller than using RAM memories with a BIST. Automotive grade coverage may be obtained for both Stuck-at (>99%) and Transition fault (>>90%).

The solution described is LBIST capable ("X" propagation prevented thanks to shadow architecture, e.g., the OR 122 introduced between Sampled Test Mode STM and Scan Enable signal SES, a logic gate which operates in combination with the one hot address decoder).

The overall number of Flip-Flop scan chains compatible with RAMs scan chains. There is no impact on the overall Scan chain architecture.

The solution here described is timing decoupled with respect to the outside world, for easy Timing Convergence and Coverage.

A one clock cycle latency may be obtained (valid on reading and both mask or no-mask writing capability).

Clock edge can be reverted (Input/output sampling on rising edge and latch on low clock).

The solution can be applied both to single and Dual-Port RAM.

Figure 17:
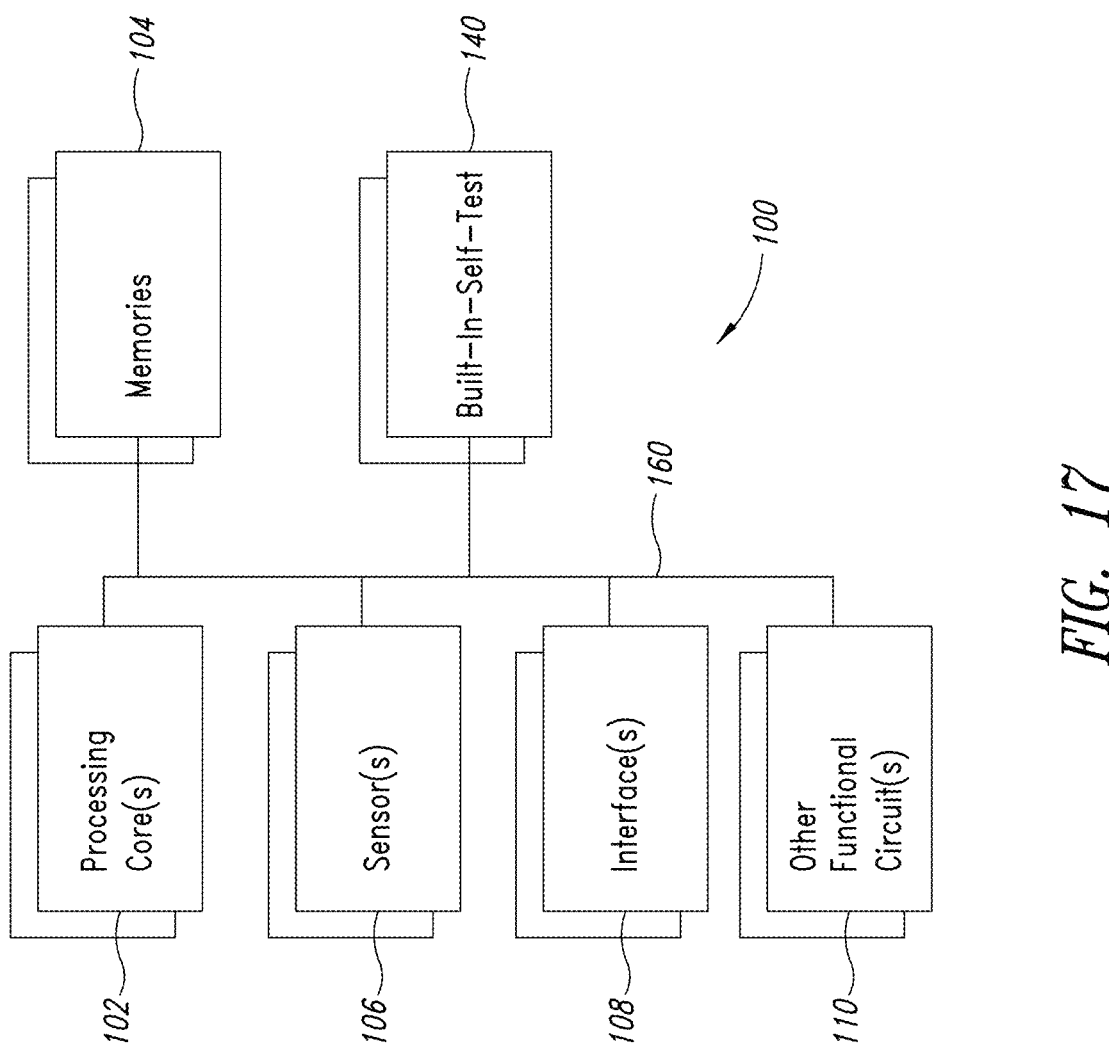
FIG. 17 is a functional block diagram of a system including an embodiment of a random access memory.

FIG. 17 is a functional block diagram of an embodiment of an electronic device or system 100 of the type to which the embodiments herein described may apply. The system 100 comprises one or more processing cores or circuits 102. The processing cores 102 may comprise, for example, one or more processors, a state machine, a microprocessor, a programmable logic circuit, discrete circuitry, logic gates, registers, etc., and various combinations thereof. The processing cores may control overall operation of the system 100, execution of application programs by the system 100, etc.

The system 100 includes one or more memories, such as one or more volatile and/or non-volatile memories which may store, for example, all or part of instructions and data related to control of the system 100, applications and operations performed by the system 100, etc. The memories 104 may comprises, for example, conventional RAM, an embodiment of a single port RAM as disclosed herein (e.g., RAM 10 of FIG. 1), an embodiment of a dual port RAM as disclosed herein (e.g., RAM 20 of FIG. 9), etc., and various combinations thereof.

The system 100 may include one or more sensors 106 (e.g., accelerometers, pressure sensors, temperature sensors, etc), one or more interfaces 108 (e.g., wireless communication interfaces, wired communication interfaces, etc.), one or more BIST circuits 140, and other circuits 110, which may include antennas, power supplies, GPUs, accelerators, AI blocks, data processing blocks, etc., and a main bus system 160. The main bus system 160 may include one or more data, address, power and/or control buses coupled to the various components of the system 100.

In some embodiments, the system 100 may include more components than illustrated, may include fewer components than illustrated, may split illustrated components into separate components, may combine illustrated components, etc., and various combinations thereof. For example, a processor 102 may have an embedded memory, such as a single port RAM as disclosed herein (e.g., an embedded RAM 10 of FIG. 1), or a dual port RAM as disclosed herein (e.g., an embedded RAM 20 of FIG. 9). In another example, the system 100 in some embodiments may not include any sensors 106. The system 100 may be implemented as separate integrated circuits coupled together, as a system-on-a-chip, etc., and various combinations thereof.

Of course, without prejudice to the principle of the invention, the details of construction and the embodiments may vary widely with respect to what has been described and illustrated herein purely by way of example, without thereby departing from the scope of the present invention, as defined by the ensuing claims.

As mentioned in the foregoing, the present disclosure provides solutions regarding a Random Access Memory comprising an array of storage elements (L) arranged in rows and columns, the rows of storage elements identifying respective memory locations, wherein said array of storage elements comprise an array of D type latches, receiving at their data input bits of the data to be stored and at their clock input a gated clock signal corresponding to the memory location to which they belong.

In variant embodiments, a column in said array of D type latches comprise D scan ready flip flops in place of D type latches.

In variant embodiments, in said array of storage elements a column of D flip flops is added to said array of D type latches.

In variant embodiments, the outputs of the latches of an address location are supplied to a data selector block selecting latch data bits corresponding to the address bits bus signal.

In variant embodiments, said random address memory comprise a clock input logic configured to provide respective gated clocks for each memory location in the array of D type latches said clock input logic comprising a one hot decoder configured to perform a one hot decoding on the write address bus obtaining one hot format addresses,
 clock gating cells configured to perform a gating of the write clock with the one hot format addresses, in particular by coupling the one hot format addresses and the write clock to the input of respective OR gates outputting respective gated clocks.

In variant embodiments, said clock input logic comprises a logic to enable testing comprising an OR gate receiving at its inputs test a test mode signal commanding the operation in test mode of the memory and a scan enable signal enabling an ATPG scan in test mode, the output of said OR gate being supplied at one input, in particular of a OR gate or a NOR gate, of said clock gating cells, another input receiving said one hot format addresses, so that if the scan enable signal is active, e.g., logic one, all the clock gating cells clock all the latches of the array of latches.

In variant embodiments, each of said clock gating cells comprises:

a latch which input is coupled to the output of an OR gate if the clock is sampled on the falling edge in said memory or to the output of a NOR gate if the clock is sampled on the rising edge in said memory, said OR gate or NOR gate receiving at its inputs said one hot format addresses and the output of said OR gate which receives at its inputs a test mode signal and a scan enable signal;
 the output of said latch being supplied to the input of an AND gate, if the clock is sampled on the falling edge in said memory or to an OR gate if the clock is sampled on the rising edge in said memory, together with the clock signal at another input, to form said gated clocks at the output of said AND gate or OR gate; and
 said latch being transparent, so that its output has the same value of its input, on the low logic value of the clock, if the clock is sampled on the falling edge in said memory, and on the high logic value of the clock, if the clock is sampled on the rising edge in said memory.

In variant embodiments, the memory comprises a mask generator comprising a multiplexer receiving on one input the latch output bits read from the latch array and on the other the bus carrying the data to be stored, while sampled mask bits are supplied as selection signal of the multiplexer, the multiplexer being configured to select as masked data bits, for the not asserted sampled mask bits said bus carrying the data to be stored (SDB), and, for the asserted sampled mask bits said latch output bits.

In variant embodiments, said mask generator further comprise a mask bypass multiplexer which receives at input the bus carrying the data to be stored and the masked data bits and selects the output of the mask generator on the basis of signal indicating masking mode or not masking mode.

In variant embodiments, said mask generator comprise an array of flip flops to resample the masked data bits with the clock edge, in particular clock rising edge.

In variant embodiments, said memory comprises an input sampling logic comprising rows of cascaded scan ready delay flip flops clocked by the write clock signal, each row sampling respectively the write address bus, the data bus and the mask bus if present and a sampling output logic configured to receive the latch output bits as input of a selection module, in particular a multiplexer, receiving also as feedback the output of the sampling output logic, configured to select the latch output bits depending on the value of a read enable signal, the output bits of the selection module being coupled to the data input of respective resampling flip flops which output forms the output of the sampling output logic.

In variant embodiments, said random address memory is a Dual port RAM, comprising a further sampling input logic, which samples read signals with a read clock and comprising a further sampling output logic also sampling read signals with said read clock.

In variant embodiments, the flip-flops of the input sampling logic, output sampling logic, and mask generator if present are scan ready D flip flops which can be coupled by a scan path, in particular one or more scan chains, suitable to be coupled to an ATPG generator in a test mode.

In variant embodiments, said latches of said array of D type latches are transparent, so that its output has the same value of its input, on the high logic value of the clock, if the clock in the memory is sampled on the falling edge in said memory, and on the low logic value of the clock, if the clock in the memory is sampled on the rising edge in said memory.

The solution here described refers also to a method for managing a Random Access Memory according to any of the embodiments comprising the operations indicated in one or more of said embodiments.

The present disclosure also provides solutions regarding a method for managing a Random Access Memory according to any of the embodiments comprising the operations indicated in one or more of said embodiments.

In an embodiment, a random access memory (RAM) comprises an array of storage elements arranged in rows and columns. The rows of the storage elements correspond to respective memory locations of the RAM. The storage elements of a row have a common gated-clock input and respective data inputs, and each row of the array of storage elements comprises a plurality of D type latches. The memory includes an address input, which, in operation, receives a memory address identifying a memory location in the RAM. Clock gating circuitry has an input coupled to the address input, and includes test mode control logic, which, in operation, generates a test mode enable signal based on a test mode signal and a scan enable signal, and a plurality of clock gating cells, which, in operation, generate respective gated-clock signals for the rows of the array of storage elements based on the memory address received at the address input and the test mode enable signal.

In an embodiment, the RAM comprises data selector circuitry coupled to outputs of the storage elements of the array, wherein the data selector circuitry, in operation, generates an output of the RAM based on the outputs of the storage elements and the memory address received at the memory input.

In an embodiment, the array of storage elements comprises a column of D type flip flops. In an embodiment, the column of D type flip flops comprises a column of D type scan-ready flip flops. In an embodiment, the RAM comprises data selector circuitry coupled to outputs of the D type latches of the array, wherein the data selector circuitry, in operation, generates an output of the RAM based on the outputs of the D type latches and the memory address received at the memory input.

In an embodiment, the clock gating circuitry includes: a one hot decoder, which, in operation, performs one hot decoding on the received memory address; and a clock input, which, in operation, receives a clock signal, wherein the plurality of clock gating cells, in operation, generate the respective gated-clock signals for the rows of the array of storage elements based on the one-hot decoding and the received clock signal. In an embodiment, the clock gating circuitry, in operation, responds to the scan enable signal by clocking all of the rows of the array of storage elements. In an embodiment, the test mode control logic comprises a first OR gate, which, in operation, receives the scan enable signal and a test mode signal, wherein the clock gating circuitry, in operation, responds to a test mode signal by clocking all of the rows of the array of storage elements. In an embodiment, each of the clock gating cells comprises: a latch having: an input coupled to the output of a second OR gate if the clock is sampled on the falling edge in the RAM or to the output of a NOR gate if the clock is sampled on the rising edge in the RAM, the second OR gate or the NOR gate receiving at its inputs an output of the one hot decoder and an output of the first OR gate; an output coupled to an input of a logic gate, wherein the logic gate is an AND gate, if the clock is sampled on the falling edge in the RAM, and the logic gate is a third OR gate, if the clock is sampled on the rising edge in the RAM; and a second input coupled to the clock input, wherein, in operation, an output of the logic gate provides a respective gated-clock signal for a row of the array of storage elements.

In an embodiment, the RAM comprises: a data input, which, in operation, receives input data; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer. In an embodiment, the mask circuit comprises a mask bypass multiplexer having a first input coupled to the data input and a second input coupled to an output of the first multiplexer of the mask circuit, wherein the mask bypass multiplexer, in operation, selects an output based on a mask mode signal. In an embodiment, the RAM comprises: a clock input, wherein the mask circuit comprises an array of flip flops, which, in operation, sample the output bits of the first multiplexer using a rising edge of a clock signal received at the clock input.

In an embodiment, the RAM comprises: write sampling logic having a plurality of rows of cascaded scan ready delay flip flops clocked by a write clock signal, wherein a first row of the cascaded scan ready delay flip flops, in operation, samples a write address bus, and a second row of the cascaded scan ready delay flip flops, in operation, samples a data bus; and output sampling logic having a first input coupled to an output of the array of storage elements, a second input coupled to an output of the sampling output logic, and a selection input, which, in operation, receives a read enable signal. In an embodiment, the RAM is a Dual port RAM, comprising read sampling logic, which, in operation, samples read signals with a read clock, wherein the output sampling logic, in operation, samples the read signals with the read clock.

In an embodiment, the RAM comprises control circuitry coupled to the array of storage elements, wherein the control circuitry includes D type flip flops coupled to a scan path, and, in a test mode of operation, the scan path receives test patterns. In an embodiment, the RAM comprises a column of D type flip flops coupled to the scan path.

In an embodiment, in operation, an output value of a D type latch of the array of memory elements is equal to an input of the D type latch on a high logic value of the clock signal, when the clock signal is sampled on a falling edge in the RAM; and the output value of the D type latch of the array of memory elements is equal to the input of the D type latch on a low logic value of the clock signal, when the clock signal is sampled on a rising edge in the RAM.

In an embodiment, a system comprises processing circuitry and a random access memory (RAM) coupled to the processing circuitry. The RAM includes an array of storage elements arranged in rows and columns. The rows of the storage elements correspond to respective memory locations of the RAM. The storage elements of a row have a common gated-clock input and respective data inputs, and each row of the array of storage elements comprises a plurality of D type latches. The memory includes an address input, which, in operation, receives a memory address identifying a memory location in the RAM. Clock gating circuitry has an input coupled to the address input, and includes test mode control logic, which, in operation, generates a test mode enable signal based on a test mode signal and a scan enable signal, and a plurality of clock gating cells, which, in operation, generate respective gated-clock signals for the rows of the array of storage elements based on the memory address received at the address input and the test mode enable signal.

In an embodiment, the RAM comprises data selector circuitry coupled to outputs of the storage elements of the array, and the data selector circuitry, in operation, generates an output of the RAM based on the outputs of the storage elements and the memory address received at the memory input.

In an embodiment, the array of storage elements comprises a column of D type flip flops. In an embodiment, the column of D type flip flops comprises a column of D type scan-ready flip flops.

In an embodiment, the clock gating circuitry includes: a one hot decoder, which, in operation, performs one hot decoding on the received memory address; and a clock input, which, in operation, receives a clock signal, wherein the plurality of clock gating cells, in operation, generate the respective gated-clock signals for the rows of the array of storage elements based on the one-hot decoding and the received clock signal. In an embodiment, the clock gating circuitry, in operation, responds to a scan enable signal by clocking all of the rows of the array of storage elements.

In an embodiment, the RAM comprises: a data input, which, in operation, receives input data; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer. In an embodiment, the RAM is a Dual port RAM.

In an embodiment, the RAM comprises control circuitry coupled to the array of storage elements, the control circuitry includes D type flip flops coupled to a scan path, and in a test mode of operation, the scan path receives test patterns.

In an embodiment, a method includes receiving, on an address input of a random access memory (RAM), a memory address identifying a memory location in the RAM. The RAM includes an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches. Respective gated-clock signals for the rows of the array of storage elements are generated based on the memory address received at the address input, a test mode signal and a scan enable signal. Memory operations are performed using storage elements of the array based on the gated-clock signals.

In an embodiment, the memory operation is a read operation, and performing the read operation comprises generating an output of the RAM based on the outputs of the storage elements and the memory address received at the memory input. In an embodiment, the memory array comprises a column of D type scan-ready flip flops. In an embodiment, performing the memory operation comprises generating an output of the RAM based on the outputs of the D type latches and the memory address received at the memory input. In an embodiment, generating the gated-clock signals comprising performing one hot decoding on the received memory address. In an embodiment, the method comprises performing a test scan of the RAM, the performing the test scan including responding to the scan enable signal by clocking all of the rows of the array of storage elements. In an embodiment, performing a memory operation comprises masking data. In an embodiment, the RAM is a dual port RAM and the method comprises managing simultaneous performance of read and write operations using the RAM.

In an embodiment, a random access memory (RAM), comprises an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches. An address input of the RAM, in operation, receives a memory address identifying a memory location in the RAM. Clock gating circuitry having an input coupled to the address input, in operation, generates respective gated-clock signals for the rows of the array of storage elements based on the memory address received at the address input. The array of storage elements comprises a column of D type flip flops.

In an embodiment, the RAM comprises data selector circuitry coupled to outputs of the storage elements of the array, wherein the data selector circuitry, in operation, generates an output of the RAM based on the outputs of the storage elements and the memory address received at the memory input. In an embodiment, the column of D type flip flops comprises a column of D type scan-ready flip flops. In an embodiment, the RAM comprises data selector circuitry coupled to outputs of the D type latches of the array, wherein the data selector circuitry, in operation, generates an output of the RAM based on the outputs of the D type latches and the memory address received at the memory input. In an embodiment, the clock gating circuitry includes: a one hot decoder, which, in operation, performs one hot decoding on the received memory address; a clock input, which, in operation, receives a clock signal; and a plurality of clock gating cells, which, in operation, generate the respective gated-clock signals for the rows of the array of storage elements based on the one-hot decoding and the received clock signal. In an embodiment, the clock gating circuitry, in operation, responds to a scan enable signal by clocking all of the rows of the array of storage elements. In an embodiment, the clock gating circuitry comprises a first OR gate, which, in operation, receives the scan enable signal and a test mode signal, wherein the clock gating circuitry, in operation, responds to a test mode signal by clocking all of the rows of the array of storage elements. In an embodiment, each of the clock gating cells comprises: a latch having: an input coupled to the output of a second OR gate if the clock is sampled on the falling edge in the RAM or to the output of a NOR gate if the clock is sampled on the rising edge in the RAM, the second OR gate or the NOR gate receiving at its inputs an output of the one hot decoder and an output of the first OR gate; an output coupled to an input of a logic gate, wherein the logic gate is an AND gate, if the clock is sampled on the falling edge in the RAM, and the logic gate is a third OR gate, if the clock is sampled on the rising edge in the RAM; and a second input coupled to the clock input, wherein, in operation, an output of the logic gate provides a respective gated-clock signal for a row of the array of storage elements.

In an embodiment, the RAM comprises: a data input, which, in operation, receives input data; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer. In an embodiment, the mask circuit comprises a mask bypass multiplexer having a first input coupled to the data input and a second input coupled to an output of the first multiplexer of the mask circuit, wherein the mask bypass multiplexer, in operation, selects an output based on a mask mode signal. In an embodiment, the RAM comprises: a clock input, wherein the mask circuit comprises an array of flip flops, which, in operation, sample the output bits of the first multiplexer using a rising edge of a clock signal received at the clock input.

In an embodiment, the RAM comprises: write sampling logic having a plurality of rows of cascaded scan ready delay flip flops clocked by a write clock signal, wherein a first row of the cascaded scan ready delay flip flops, in operation, samples a write address bus, and a second row of the cascaded scan ready delay flip flops, in operation, samples a data bus; and output sampling logic having a first input coupled to an output of the array of storage elements, a second input coupled to an output of the sampling output logic, and a selection input, which, in operation, receives a read enable signal. In an embodiment, the RAM is a Dual port RAM, comprising read sampling logic, which, in operation, samples read signals with a read clock, wherein the output sampling logic, in operation, samples the read signals with the read clock.

In an embodiment, the RAM comprises control circuitry coupled to the array of storage elements, wherein the control circuitry includes D type flip flops coupled to a scan path, and, in a test mode of operation, the scan path receives test patterns. In an embodiment, the D type flip flops of the column of D type flip flops are coupled to the scan path.

In an embodiment, in operation, an output value of a D type latch of the array of memory elements is equal to an input of the D type latch on a high logic value of the clock signal, when the clock signal is sampled on a falling edge in the RAM; and the output value of the D type latch of the array of memory elements is equal to the input of the D type latch on a low logic value of the clock signal, when the clock signal is sampled on a rising edge in the RAM.

In an embodiment, a system comprises processing circuit, and a random access memory (RAM) coupled to the processing circuitry. The RAM includes an array of storage elements arranged in a plurality of rows and a plurality of columns. The rows of the storage elements correspond to respective memory locations of the RAM. The storage elements of a row have a common gated-clock input and respective data inputs, and rows of the array of storage elements comprise a plurality of D type latches. An address input, in operation, receives a memory address identifying a memory location in the RAM. Clock gating circuitry having an input coupled to the address input, in operation, generates respective gated-clock signals for the rows of the array of storage elements based on the memory address received at the address input. The array of storage elements comprises a column of D type flip flops.

In an embodiment, the RAM comprises data selector circuitry coupled to outputs of the storage elements of the array, and the data selector circuitry, in operation, generates an output of the RAM based on the outputs of the storage elements and the memory address received at the memory input. In an embodiment, the column of D type flip flops comprises a column of D type scan-ready flip flops. In an embodiment, the clock gating circuitry includes: a one hot decoder, which, in operation, performs one hot decoding on the received memory address; a clock input, which, in operation, receives a clock signal; and a plurality of clock gating cells, which, in operation, generate the respective gated-clock signals for the rows of the array of storage elements based on the one-hot decoding and the received clock signal. In an embodiment, the clock gating circuitry, in operation, responds to a scan enable signal by clocking all of the rows of the array of storage elements. In an embodiment, the RAM comprises: a data input, which, in operation, receives input data; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer. In an embodiment, the RAM is a Dual port RAM. In an embodiment, the RAM comprises control circuitry coupled to the array of storage elements, the control circuitry includes D type flip flops coupled to a scan path, and in a test mode of operation, the scan path receives test patterns.

In an embodiment, a method includes receiving, on an address input of a random access memory (RAM), a memory address identifying a memory location in the RAM. The RAM includes an array of storage elements arranged in rows and columns, wherein the rows of the storage elements correspond to respective memory locations of the RAM, the storage elements of a row have a common gated-clock input and respective data inputs, each row of the array of storage elements comprises a plurality of D type latches, and the array of storage elements comprises a column of D type flip flops. Respective gated-clock signals for the rows of the array of storage elements are generated, using clock gating circuitry of the RAM having an input coupled to the address input, based on the memory address received at the address input. A memory operation is performed using storage elements of the array based on the gated-clock signals.

In an embodiment, the memory operation is a read operation, and performing the read operation comprises generating an output of the RAM based on the outputs of the storage elements and the memory address received at the memory input. In an embodiment, the column of D type flip flops comprises a column of D type scan-ready flip flops. In an embodiment, the memory operation comprises generating an output of the RAM based on the outputs of the D type latches and the memory address received at the memory input. In an embodiment, the generating the gated-clock signals comprising performing one hot decoding on the received memory address. In an embodiment, the method comprises performing a test scan of the RAM, the performing the test scan including responding to a scan enable signal by clocking all of the rows of the array of storage elements. In an embodiment, the performing a memory operation comprises masking data. In an embodiment, the RAM is a dual port RAM, and the method comprises managing simultaneous performance of read and write operations using the RAM.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-transitory computer-readable medium method having contents which configure a processing device including a random access memory (RAM) to perform a method, the method comprising:

receiving, on an address input of the RAM, a memory address identifying a memory location in the RAM, the RAM including an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches;

generating, using clock gating circuitry of the RAM having an input coupled to the address input, respective gated-clock signals for the rows of the array of storage elements based on the memory address received at the address input, a test mode signal and a scan enable signal; and performing memory operations using storage elements of the array based on the gated-clock signals.

2. The non-transitory computer-readable medium of claim 1, wherein the memory operation is a read operation, and performing the read operation comprises generating an output of the RAM based on the outputs of the storage elements and the memory address received at the memory input.

3. The non-transitory computer-readable medium of claim 1, wherein the method comprises:

performing one-hot decoding on the received memory address;

receiving a clock signal; and generating the respective gated-clock signals for the rows of the array of storage elements based on the one-hot decoding and the received clock signal.

4. The non-transitory computer-readable medium of claim 1, wherein the contents include instructions executable by the RAM.

5. A random access memory (RAM), comprising:

an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches;

an address input, which, in operation, receives a memory address identifying a memory location in the RAM; and clock gating circuitry having an input coupled to the address input, wherein the clock gating circuitry includes:

a one-hot decoder, which, in operation, provides one-hot decoding on the received memory address; and a clock input, which, in operation, receives a clock signal, wherein the clock gating circuitry, in operation, generates respective gated-clock signals for the rows of the array of storage elements based on the one-hot decoding and the received clock signal.

6. The RAM of claim 5, wherein the clock gating circuitry comprises:

a plurality of clock gating cells, which, in operation, generate the respective gated-clock signals for the rows of the array of storage elements.

7. The RAM of claim 5, wherein the clock gating circuitry comprises:

test mode control logic, which, in operation, generates a test mode enable signal based on a test mode signal and a scan enable signal, wherein the clock gating circuitry, in operation, generates the respective gated-clock signals for the rows of the array of storage elements based on the test mode enable signal.

8. The RAM of claim 7, wherein the clock gating circuitry, in operation, responds to the scan enable signal by clocking all of the rows of the array of storage elements.

9. The RAM of claim 8, wherein the test mode control logic comprises a first OR gate, which, in operation, receives the scan enable signal and a test mode signal, wherein the clock gating circuitry, in operation, responds to a test mode signal by clocking all of the rows of the array of storage elements.

10. The RAM of claim 6, wherein each of the clock gating cells comprises:

a latch having:

an input coupled to an output of a first OR gate if the clock is sampled on a falling edge in the RAM or to the output of a NOR gate if the clock is sampled on a rising edge in the RAM, the first OR gate or the NOR gate receiving at its inputs an output of the one-hot decoder and an output of a second OR gate;

an output coupled to an input of a logic gate, wherein the logic gate is an AND gate, if the clock is sampled on the falling edge in the RAM, and the logic gate is a third OR gate, if the clock is sampled on the rising edge in the RAM; and a second input coupled to the clock input, wherein, in operation, an output of the logic gate provides a respective gated-clock signal for a row of the array of storage elements.

11. The RAM of claim 5, comprising:

a data input, which, in operation, receives input data; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer.

12. The RAM of claim 7, comprising:

write sampling logic having a plurality of rows of cascaded scan ready delay flip flops clocked by a write clock signal, wherein a first row of the cascaded scan ready delay flip flops, in operation, samples a write address bus, and a second row of the cascaded scan ready delay flip flops, in operation, samples a data bus; and output sampling logic having a first input coupled to an output of the array of storage elements, a second input coupled to an output of the sampling output logic, and a selection input, which, in operation, receives a read enable signal.

13. The RAM of claim 12, wherein the RAM is a Dual port RAM, comprising read sampling logic, which, in operation, samples read signals with a read clock, wherein the output sampling logic, in operation, samples the read signals with the read clock.

14. A random access memory (RAM), comprising:

an array of storage elements arranged in rows and columns, wherein the rows of the storage elements correspond to respective memory locations of the RAM, the storage elements of a row have a common gated-clock input and respective data inputs, and each row of the array of storage elements comprises a plurality of D type latches;

an address input, which, in operation, receives a memory address identifying a memory location in the RAM;

a data input, which, in operation, receives input data;

clock gating circuitry having an input coupled to the address input, wherein the clock gating circuitry, in operation, generates respective gated-clock signals for the rows of the array of storage elements based on one-hot decoding and the received clock signal; and a mask circuit, the mask circuit including a first multiplexer having a first input coupled to an output of the array of storage elements, a second input coupled to the data input, and a selection input, wherein the selection input of the first multiplexer, in operation, receives sampled mask bits, wherein, in operation, the first multiplexer selects output bits from bits received on the first input of the first multiplexer and bits received on the second input of the first multiplexer based on sampled mask bits received at the selection input of the first multiplexer.

15. The RAM of claim 14, wherein the mask circuit comprises a mask bypass multiplexer having a first input coupled to the data input and a second input coupled to an output of the first multiplexer of the mask circuit, wherein the mask bypass multiplexer, in operation, selects an output based on a mask mode signal.

16. The RAM of claim 14, comprising:

a clock input, wherein the mask circuit comprises an array of flip flops, which, in operation, sample the output bits of the first multiplexer using a rising edge of a clock signal received at the clock input.

17. A system, comprising:

processing circuitry; and a random access memory (RAM) coupled to the processing circuitry, the RAM including:

an array of storage elements arranged in a plurality of rows and a plurality of columns, wherein the rows of the storage elements correspond to respective memory locations of the RAM, the storage elements of a row have a common gated-clock input and respective data inputs, and rows of the array of storage elements comprise a plurality of D type latches;

an address input, which, in operation, receives a memory address identifying a memory location in the RAM; and clock gating circuitry having an input coupled to the address input, wherein the clock gating circuitry comprises:

a one-hot decoder, which, in operation, provides one-hot decoding on the received memory address; and a clock input, which, in operation, receives a clock signal, wherein the clock gating circuitry, in operation, generates respective gated-clock signals for the rows of the array of storage elements based on the one-hot decoding and the received clock signal.

18. The system of claim 17, wherein the RAM comprises data selector circuitry coupled to outputs of the storage elements of the array, and the data selector circuitry, in operation, generates an output of the RAM based on the outputs of the storage elements and the memory address received at the memory input.

19. The system of claim 17, wherein the RAM is a Dual port RAM.

20. The system of claim 17, wherein:

the RAM comprises control circuitry coupled to the array of storage elements, the control circuitry includes D type flip flops coupled to a scan path, and in a test mode of operation, the scan path receives test patterns.

* * * * *